US009076544B2

(12) United States Patent
Mokhlesi et al.

(10) Patent No.: US 9,076,544 B2
(45) Date of Patent: Jul. 7, 2015

(54) OPERATION FOR NON-VOLATILE STORAGE SYSTEM WITH SHARED BIT LINES

(71) Applicant: SANDISK TECHNOLOGIES INC., Plano, TX (US)

(72) Inventors: Nima Mokhlesi, Los Gatos, CA (US); Mohan V. Dunga, Santa Clara, CA (US); Man Mui, Santa Clara, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 159 days.

(21) Appl. No.: 13/674,470

(22) Filed: Nov. 12, 2012

(65) Prior Publication Data

US 2013/0128669 A1     May 23, 2013

Related U.S. Application Data

(60) Provisional application No. 61/561,286, filed on Nov. 18, 2011.

(51) Int. Cl.

| | |
|---|---|
| *G11C 16/34* | (2006.01) |
| *G11C 16/26* | (2006.01) |
| *G11C 16/24* | (2006.01) |
| *G11C 11/56* | (2006.01) |
| *G11C 16/04* | (2006.01) |
| *H01L 27/115* | (2006.01) |

(52) U.S. Cl.
CPC .............. *G11C 16/26* (2013.01); *G11C 16/24* (2013.01); *G11C 11/5642* (2013.01); *G11C 16/0483* (2013.01); *G11C 16/3427* (2013.01); *H01L 27/11524* (2013.01)

(58) Field of Classification Search
CPC ...... G11C 16/24; G11C 16/26; G11C 16/0483
USPC ......................................... 365/185.25, 185.17
See application file for complete search history.

(56) References Cited

U.S. PATENT DOCUMENTS

| | | | | |
|---|---|---|---|---|
| 5,579,260 | A | * | 11/1996 | Iwahashi .................. 365/185.24 |
| 6,028,788 | A | | 2/2000 | Choi |
| 6,091,633 | A | | 7/2000 | Cernea |
| 6,151,249 | A | | 11/2000 | Shirota |
| 6,191,975 | B1 | * | 2/2001 | Shimizu et al. .......... 365/185.17 |

(Continued)

OTHER PUBLICATIONS

Shin, et al., "A New Shared Bit Line NAND Cell Technology for the 256Mb Flash Memory with 12V Programming,"Samsung Electronics Co., Ltd., Korea, 1996 IEEE.

(Continued)

*Primary Examiner* — Hoai V Ho
*Assistant Examiner* — Jay Radke
(74) *Attorney, Agent, or Firm* — Vierra Magen Marcus LLP

(57) ABSTRACT

A non-volatile storage system is disclosed that includes pairs of NAND strings (or other groupings of memory cells) in the same block being connected to and sharing a common bit line. To operate the system, two selection lines are used so that the NAND strings (or other groupings of memory cells) sharing a bit line can be selected at the block level. Both selection lines are connected to a selection gate for each of the NAND strings (or other groupings of memory cells) sharing the bit line. One set of embodiments avoid unwanted boosting during read operations by keeping the channels of the memory cells connected to word lines on the drain side of the selected word line biased at a fixed potential.

22 Claims, 38 Drawing Sheets

(56) References Cited

U.S. PATENT DOCUMENTS

| | | | |
|---|---|---|---|
| 6,243,295 B1* | 6/2001 | Satoh | 365/185.17 |
| 6,480,422 B1 | 11/2002 | Wong | |
| 6,620,683 B1 | 9/2003 | Lin | |
| 7,169,624 B2 | 1/2007 | Hsu | |
| 7,237,074 B2 | 6/2007 | Guterman | |
| 7,244,984 B2 | 7/2007 | Kamigaichi | |
| 7,508,714 B2 | 3/2009 | Fasoli | |
| 2003/0206443 A1* | 11/2003 | Sakui et al. | 365/185.17 |
| 2003/0206455 A1* | 11/2003 | Hsu et al. | 365/200 |
| 2007/0133295 A1* | 6/2007 | Fong et al. | 365/185.21 |
| 2007/0285983 A1 | 12/2007 | Ishii | |
| 2008/0094902 A1* | 4/2008 | Lee | 365/185.17 |
| 2009/0168534 A1 | 7/2009 | Park | |
| 2009/0268524 A1 | 10/2009 | Maejima | |
| 2009/0302472 A1 | 12/2009 | Yoon | |
| 2012/0147676 A1 | 6/2012 | Mokhlesi | |

OTHER PUBLICATIONS

International Search Report dated Feb. 20, 2013, PCT Patent Application No. PCT/US2012/064818.

Written Opinion of the International Searching Authority dated Feb. 20, 2013, PCT Patent Application No. PCT/US2012/064818.

U.S. Appl. No. 14/290,882, filed May 29, 2014.

Response to Office Action dated Oct. 3, 2014, U.S. Appl. No. 14/290,882.

Office Action dated Jul. 18, 2014, U.S. Appl. No. 14/290,882, filed May 29, 2014.

Final Office Action dated Oct. 28, 2014, U.S. Appl. No. 14/290,882.

Response to Final Office Action dated Jan. 13, 2015, U.S. Appl. No. 14/290,882.

Notice of Allowance dated Feb. 10, 2015, U.S. Appl. No. 14/290,882.

\* cited by examiner

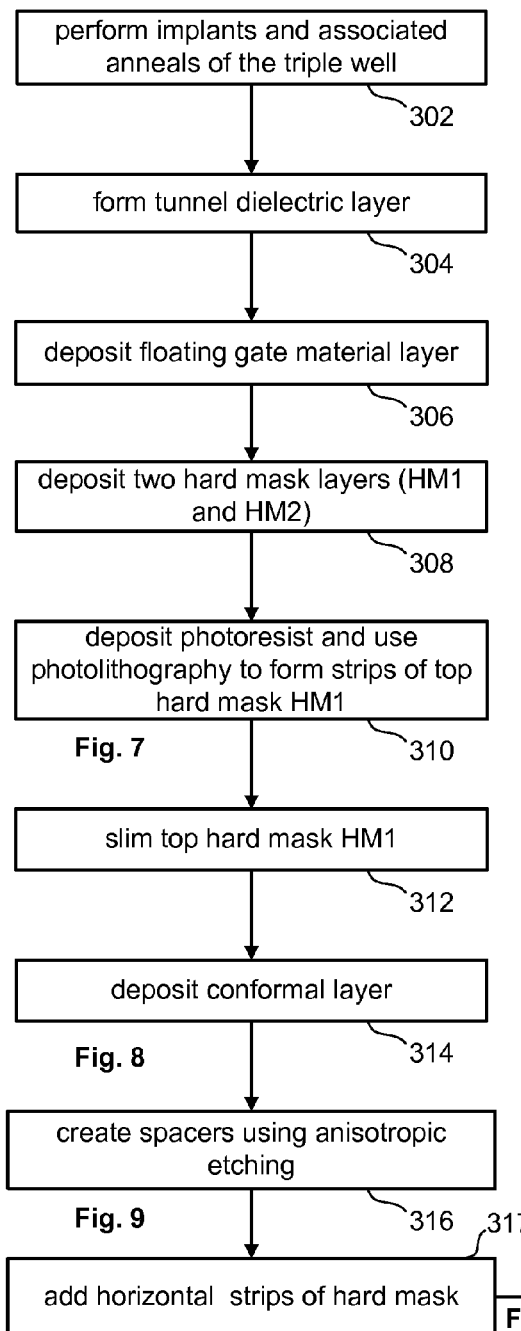

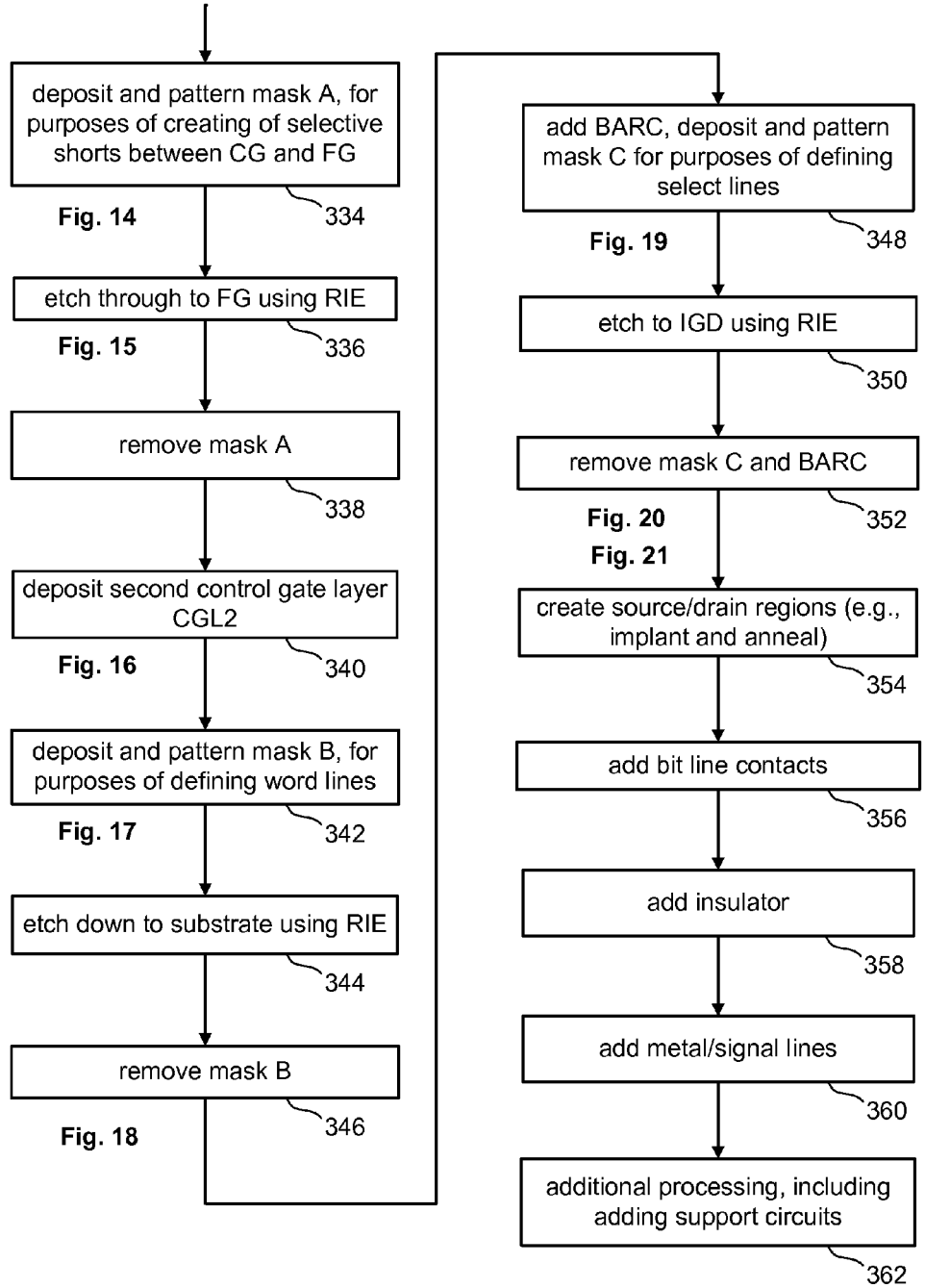

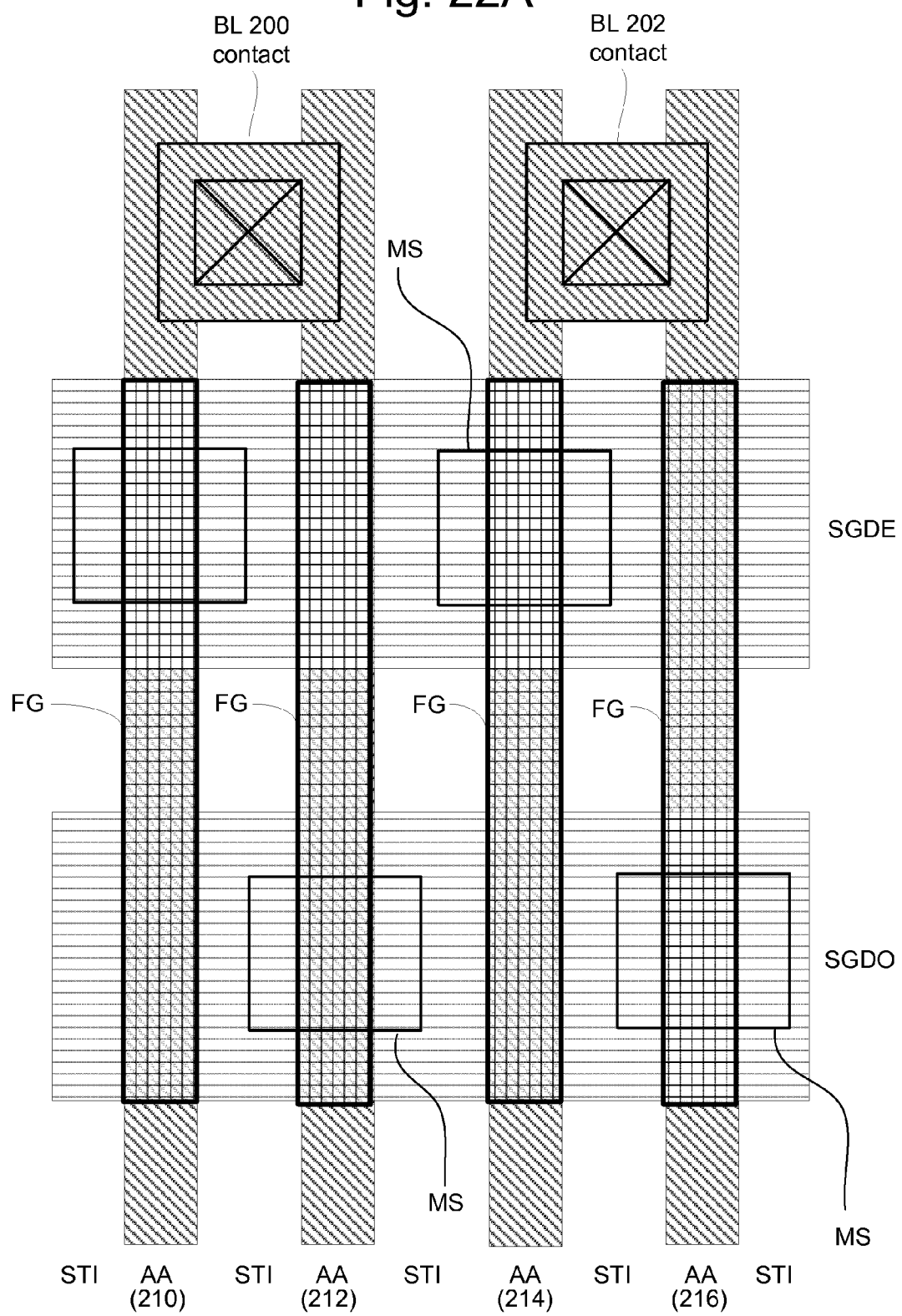

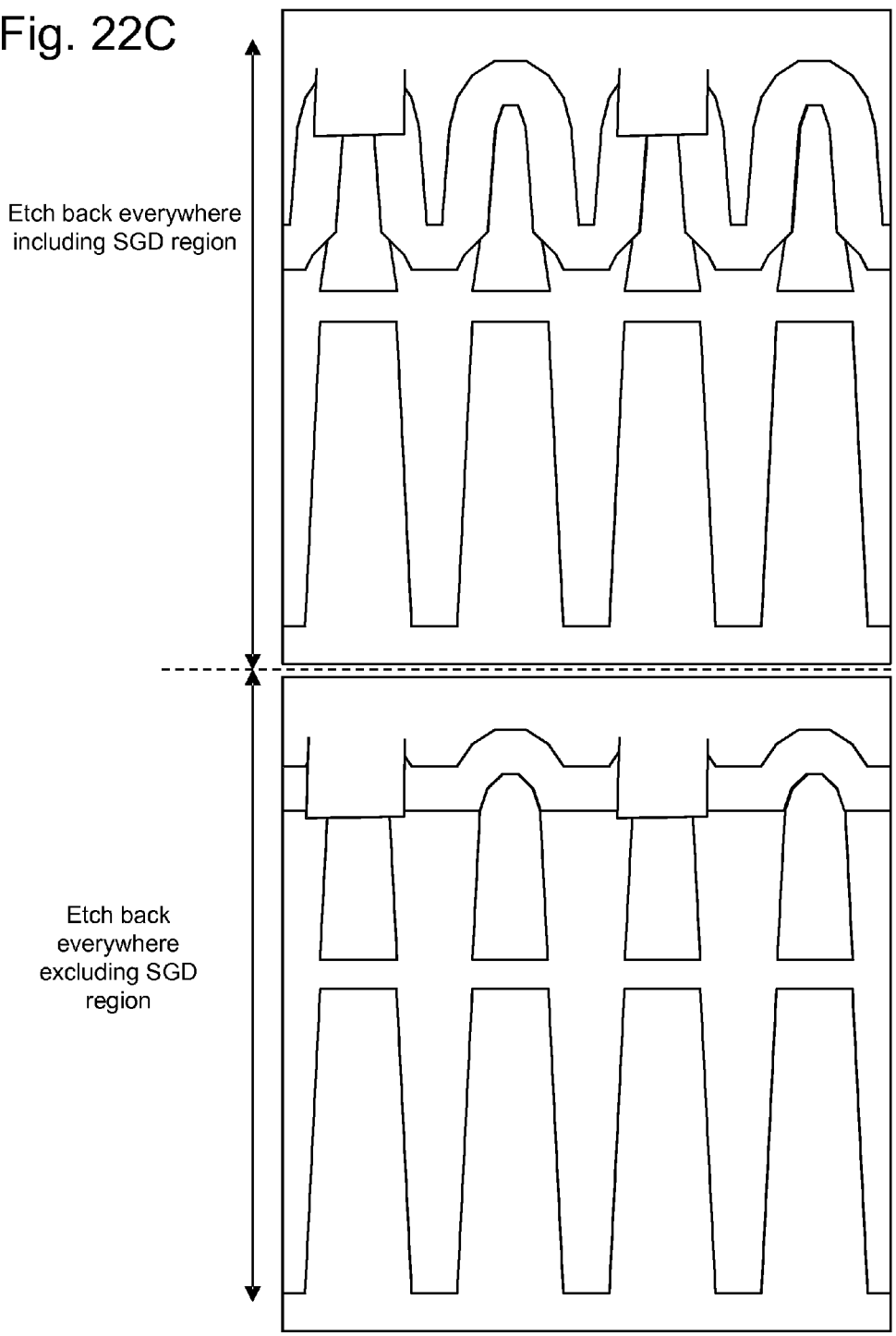

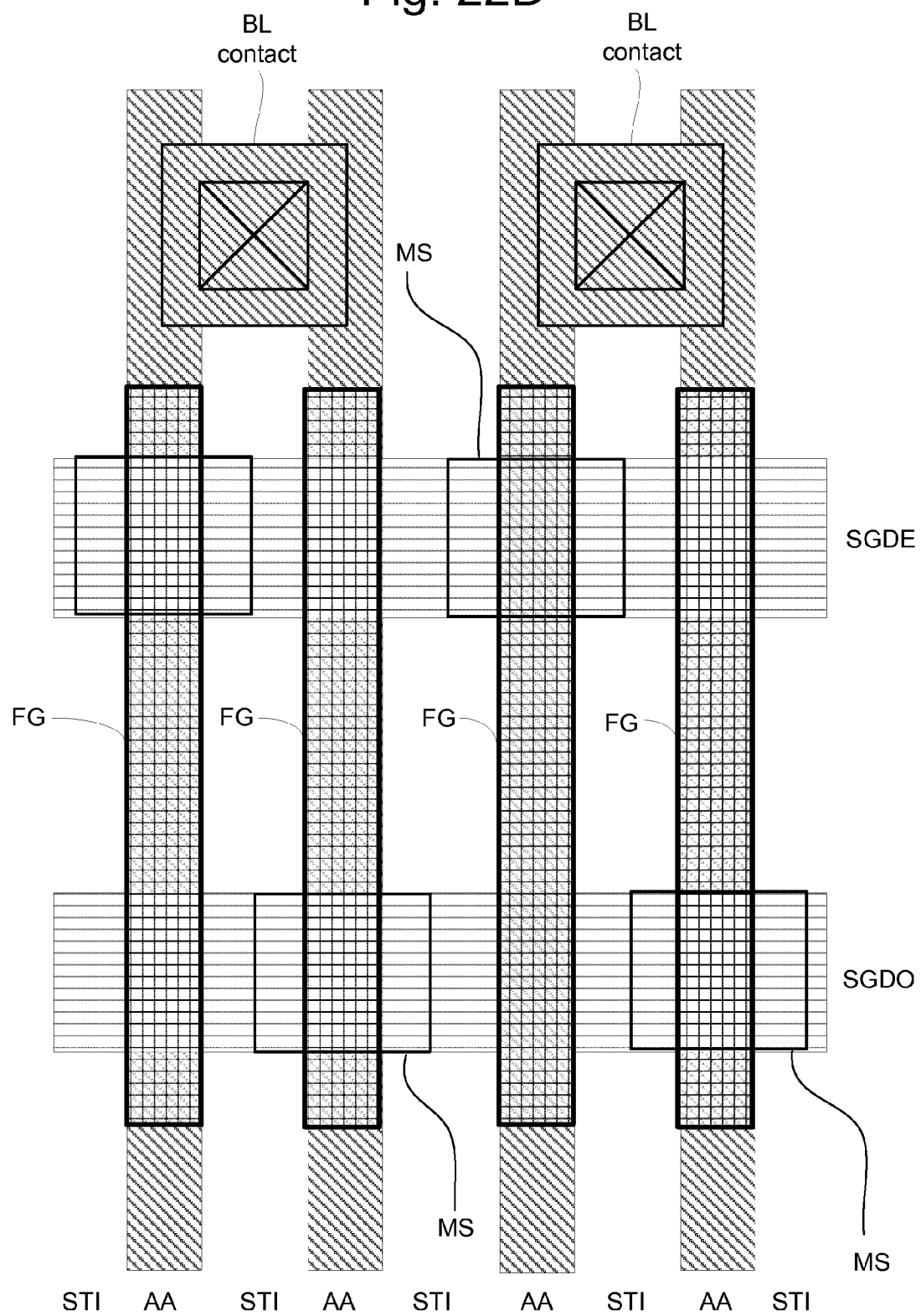

Fig. 24

|        | T1 | T2    | T3    | T4    | T5    | T6 |
|--------|----|-------|-------|-------|-------|----|
| BL200  | 0  | Vdd   | Vdd   | 0     | 0     | 0  |
| BL202  | 0  | Vdd   | Vdd   | Vdd   | Vdd   | 0  |
|        |    |       |       |       |       |    |
| SGDE   | 0  | Vdd   | Vdd   | Vsgd  | Vsgd  | 0  |
| SGDO   | 0  | Vdd   | 0     | 0     | 0     | 0  |
|        |    |       |       |       |       |    |
| WLn=2  | 0  | Vpass | Vpass | Vpass | Vpgm  | 0  |
| WLn ≠2 | 0  | Vpass | Vpass | Vpass | Vpass | 0  |
|        |    |       |       |       |       |    |
| SGS    | 0  | 0     | 0     | 0     | 0     | 0  |

Fig. 25

|        | T1 | T2      | T3      | T4    | T5    | T6 |
|--------|----|---------|---------|-------|-------|----|
| BL200  | 0  | Vdd     | 0       | 0     | 0     | 0  |
| BL202  | 0  | Vdd     | Vdd     | Vdd   | Vdd   | 0  |
|        |    |         |         |       |       |    |
| SGDE   | 0  | Vdd     | Vdd     | Vsgd  | Vsgd  | 0  |
| SGDO   | 0  | Vdd     | 0       | 0     | 0     | 0  |
|        |    |         |         |       |       |    |
| WLn=2  | 0  | 0V (V1) | 0V (V1) | Vpass | Vpgm  | 0  |
| WLn ≠2 | 0  | 0V (V1) | 0V (V1) | Vpass | Vpass | 0  |
|        |    |         |         |       |       |    |
| SGS    | 0  | 0       | 0       | 0     | 0     | 0  |

Fig. 26

|        | T1 | T2      | T3      | T4    | T5    | T6 |
|--------|----|---------|---------|-------|-------|----|
| BL200  | 0  | Vdd     | 0       | 0     | 0     | 0  |
| BL202  | 0  | Vdd     | Vdd     | Vdd   | Vdd   | 0  |
|        |    |         |         |       |       |    |
| SGDE   | 0  | 0       | Vdd     | Vsgd  | Vsgd  | 0  |
| SGDO   | 0  | Vdd     | 0       | 0     | 0     | 0  |
|        |    |         |         |       |       |    |
| WLn=2  | 0  | 0V (V1) | 0V (V1) | Vpass | Vpgm  | 0  |
| WLn ≠2 | 0  | 0V (V1) | 0V (V1) | Vpass | Vpass | 0  |
|        |    |         |         |       |       |    |
| SGS    | 0  | 0       | 0       | 0     | 0     | 0  |

OPERATION FOR NON-VOLATILE STORAGE SYSTEM WITH SHARED BIT LINES

This application claims priority from U.S. Provisional Application 61/561,286, filed on Nov. 18, 2012, incorporated herein by reference in its entirety.

BACKGROUND OF THE INVENTION

1. Field

The present invention relates to non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and in U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states: an erased state and a programmed state that correspond to data "1" and data "0." Such a device is referred to as a binary device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

To increase the capacity of non-volatile storage systems and/or reduced the size of the systems, there has been a trend to shrink the area needed to implement the memory structure. However, as process geometries shrink, many design and process challenges are presented.

BRIEF DESCRIPTION OF THE DRAWINGS

FIGS. 6A-6B depict a flow chart describing one embodiment of a portion of a process for fabricating a non-volatile storage system.

FIGS. 22A, 22B and 22D-22G depict a top view of the select gates for various embodiments of the technology described herein.

FIG. 22C shows a cross section across multiple NAND strings.

FIG. 24 is a table that shows various voltages used for one embodiment of a process for programming a non-volatile storage system that uses the technology described herein.

FIG. 25 is a table that shows various voltages used for one embodiment of a process for programming a non-volatile storage system that uses the technology described herein.

FIG. 26 is a table that shows various voltages used for one embodiment of a process for programming a non-volatile storage system that uses the technology described herein.

DETAILED DESCRIPTION

A non-volatile storage system is disclosed that includes pairs of NAND strings (or other groupings of memory cells) in the same block being connected to and sharing a common bit line. By sharing bit lines, less bit lines are needed in the storage system. Using less bit lines reduces the space needed to implement the storage system. To operate the system, two selection lines are used so that the NAND strings (or other groupings of memory cells) sharing a bit line can be selected at the block level. Both selection lines are physically connected, but only one of the selection lines is electrically connected, to a single selection gate for each of the NAND strings (or other groupings of memory cells) sharing the bit line. In other embodiments, the more than two NAND strings (or other groupings of connected memory cells) can share a bit line.

Figure 1:
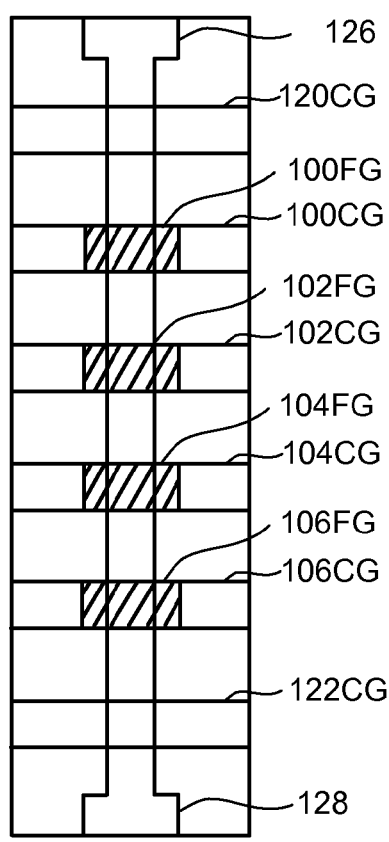
FIG. 1 is a top view of a NAND string.
Figure 2:
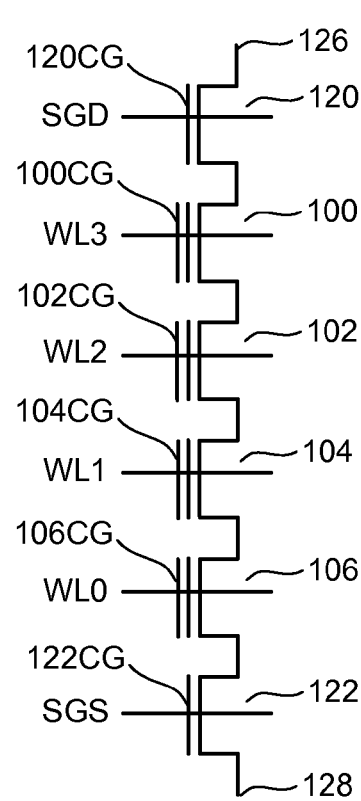
FIG. 2 is an equivalent circuit diagram of the NAND string.

One set of embodiments avoids unwanted boosting during read operations by causing the channels of the memory cells connected to word lines on the drain side of the selected word line WLn to be at a fixed potential (rather than floating). One example includes causing the channels of the memory cells connected to word lines on the drain side of the selected word line WLn and on the source side of the selected word line WLn to be at the same fixed potential. In some embodiments, the same fixed channel potential (for unselected memory cells) will be used during both verify and read operations One example (but not the only example) of a non-volatile storage system that can be used to implement the technology described herein is a flash memory system that uses the NAND structure, which includes arranging multiple transistors in series, sandwiched between two select gates. The transistors in series and the select gates are referred to as a NAND string. FIG. 1 is a top view showing one prior art NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. The use of the terms connect, connected, and connection in this document can include a direct connection or an indirect connection. Each bit line and the respective NAND string(s) that are connected to that bit line via a bit line contact make up the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. Other types of non-volatile storage devices, in addition to NAND flash memory, can also be used.

Figure 3:
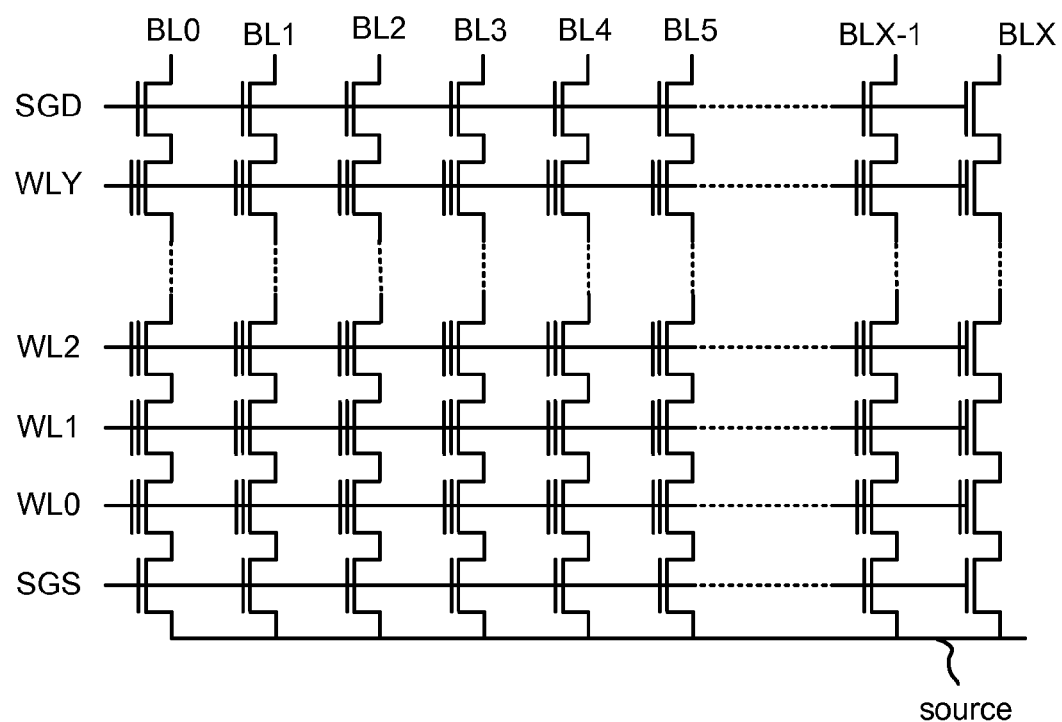
FIG. 3 is a block diagram depicting one embodiment of a block in a prior art memory array.

FIG. 3 provides one example of a block of memory cells implemented in prior art memory systems. As can be seen, each NAND string includes many memory cells. For example FIG. 3 shows each NAND string including Y memory cells. Each NAND string is connected to one bit line. There is one drain side selection signal SGD and one source side selection signal SGS.

In order to save space on the semiconductor die, it is proposed that two NAND strings (or other grouping of memory cells) share a single bit line. One proposal for having two NAND strings share a bit line includes using two select gates at the drain side (same end) of each NAND string in order to connect or disconnect a NAND string from a bit line. For example, looking at FIG. 3, the signal SGD would be replaced by two signals SGD1 and SGD2. Each NAND string would then have two drain side select gates, each connected to a different drain side selection signal. One of the two drain side select gates for each NAND string would be a depletion mode transistor with its threshold voltage lower than 0 volts. One problem with using two select gates on the drain side of each NAND string is that two drain side select gates (as compared to one drain side select transistor) require more area on the die. Therefore, the technology described herein proposes to only use one drain side selection gate for each NAND string, with two drain side selection signals.

Figure 4:
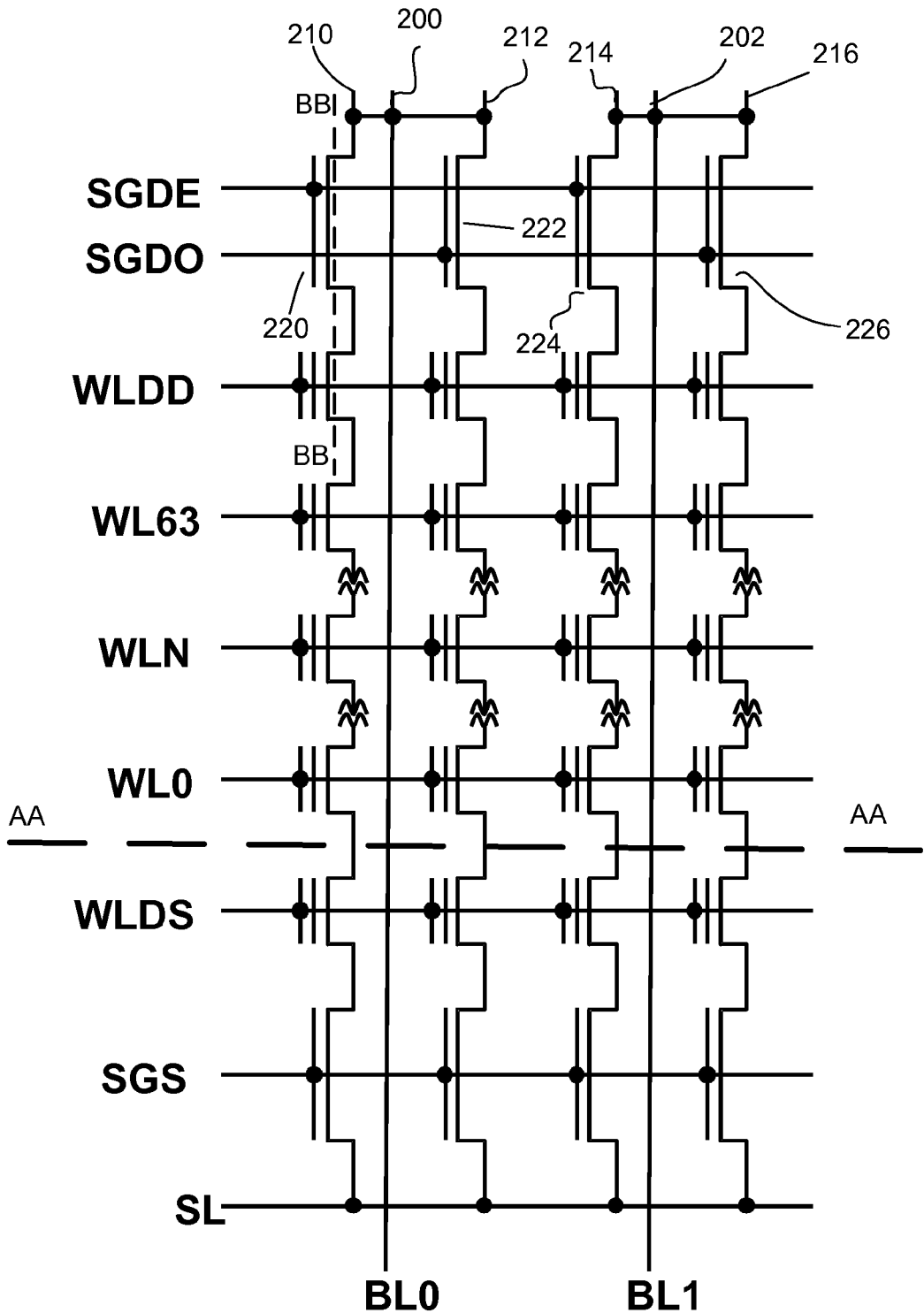
FIG. 4 is a block diagram depicting one embodiment of a portion of a memory array according to the technology described herein.

FIG. 4 is a portion of a first embodiment of a memory system for which a bit line is shared between two NAND strings, where each NAND string includes only one drain side selection gate and the block includes two drain side selection signals. For example, FIG. 4 shows four NAND strings from a block of NAND strings that includes more than four NAND strings. Each NAND string includes 64 data memory cells (WL0 . . . WL63) with one or more dummy memory cells on each side of the data memory cells. In other embodiments, more or less than 64 data memory cells can be included on a NAND string. The block of memory cells will include two drain side selection signals SGDE and SGDO. FIG. 4 shows two bit lines 200 and 202. Bit line 200 is connected to NAND string 210 and NAND string 212. Bit line 202 is connected to NAND string 214 and NAND string 216. The drain side selection signal SGDE is used to select or unselect NAND string 210 and NAND string 214. The drain side signal SGDO is used to select NAND string 212 and NAND string 216. Each NAND string only includes only one drain side selection gate, implemented as a single transistor. For example NAND string 210 includes drain side selection gate 220, NAND string 212 includes drain side selection gate 222, NAND string 214 includes drain side selection gate 224 and NAND string 216 includes drain side selection gate 226. Both selection signals SGDE and SGDO are physically connected to selection gate 220, selection gate 222, selection gate 224 and selection gate 226. Selection signal line SGDE is in electrical communication with selection gate 210 and selection gate 214, while being electrically insulated from selection gate 222 and selection gate 226. Similarly, signal line SGDO is in electrical communication with selection gate 222 and selection gate 226, and electrically insulated from selection gate 220 and selection gate 224. Additional implementation details are described below.

Figure 5:
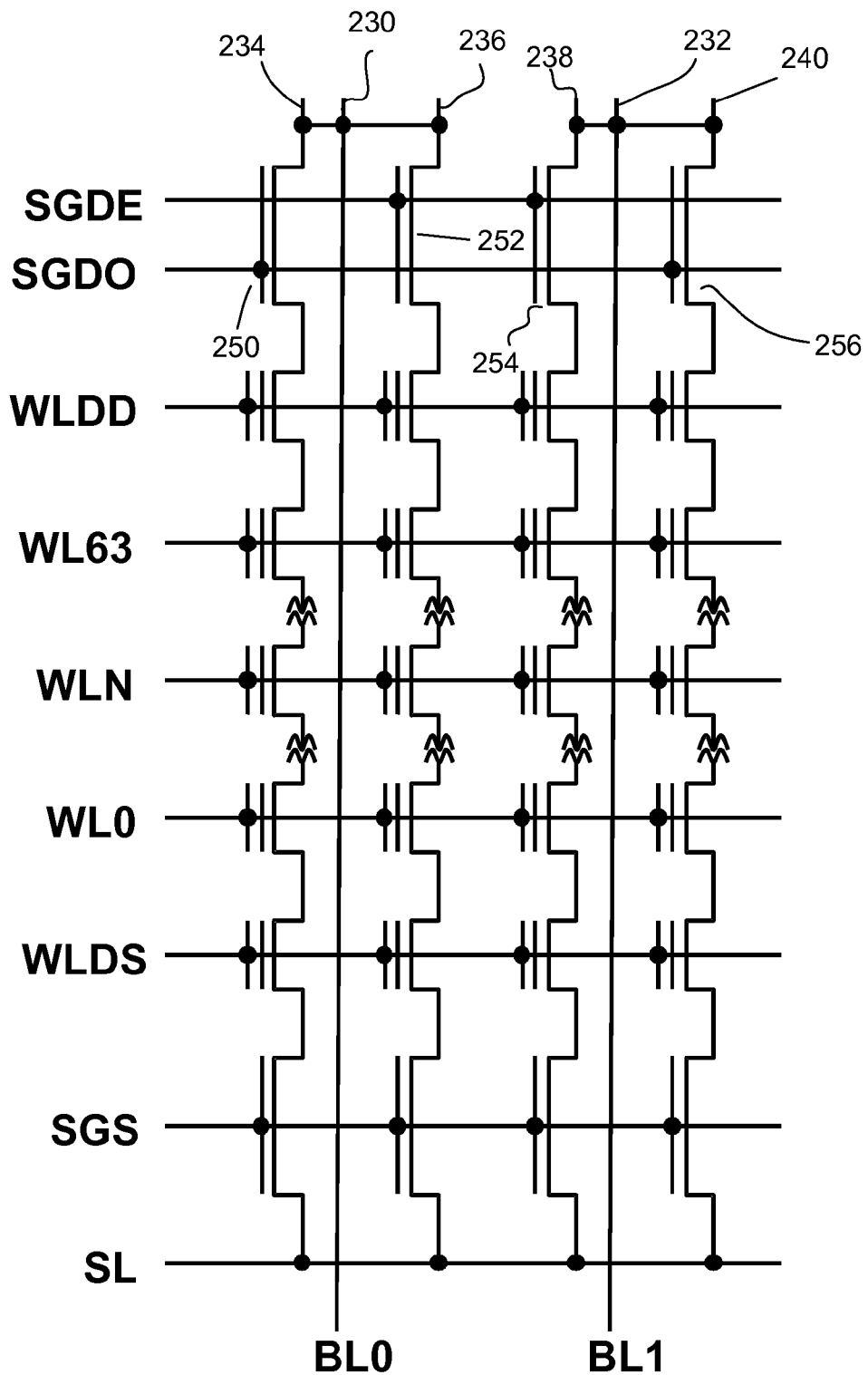
FIG. 5 is a block diagram depicting one embodiment of a portion of a memory array according to the technology described herein.

FIG. 5 provides another embodiment for sharing a bit line between two NAND strings. FIG. 5 shows bit lines 230 and 232. Bit line 230 is connected to and shared by NAND string 234 and NAND string 236. Bit line 232 is connected to and shared by NAND string 238 and NAND string 240. FIG. 5 shows selection signal lines SGDE and SGDO physically connected to the selection gates 250, 252, 254 and 256. Selection signal line SGDE is in electrical communication with selection gate 252 and selection gate 254, while being electrically insulated from selection gate 250 and selection gate 256. Selection signal line SGDO is in electrical communication with selection gate 250 and selection gate 256, while being electrically insulated from selection gate 252 and selection gate 254. A difference between the embodiments of FIG. 4 and FIG. 5 is that the embodiment of FIG. 4 alternates such that every other NAND string has its selection gate electrically in electric communication with the same selection signal line while the embodiment of FIG. 5 has adjacent pairs of NAND strings in electric communication with the same selection signal line.

Figure 8:
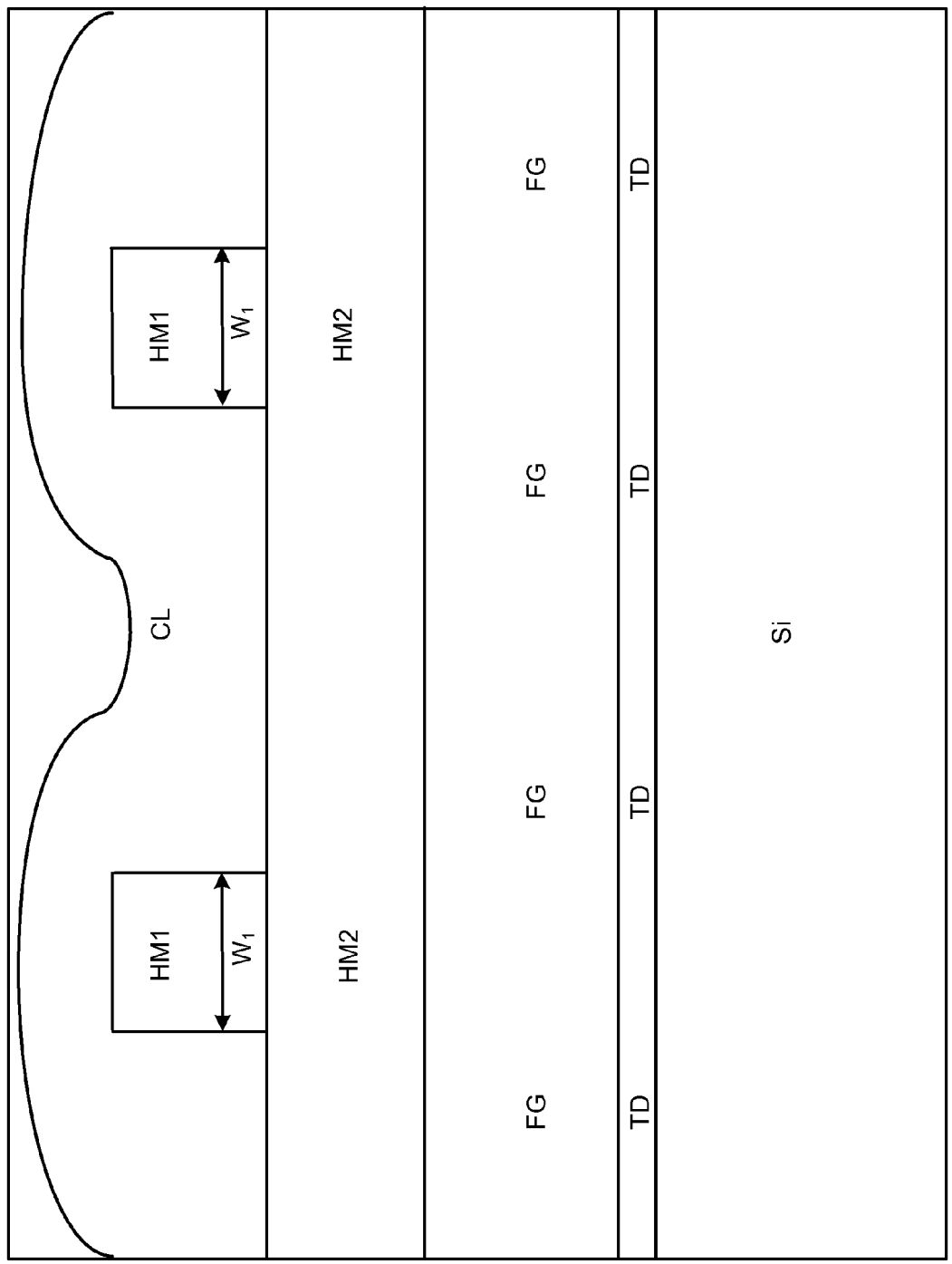
Figure 9:
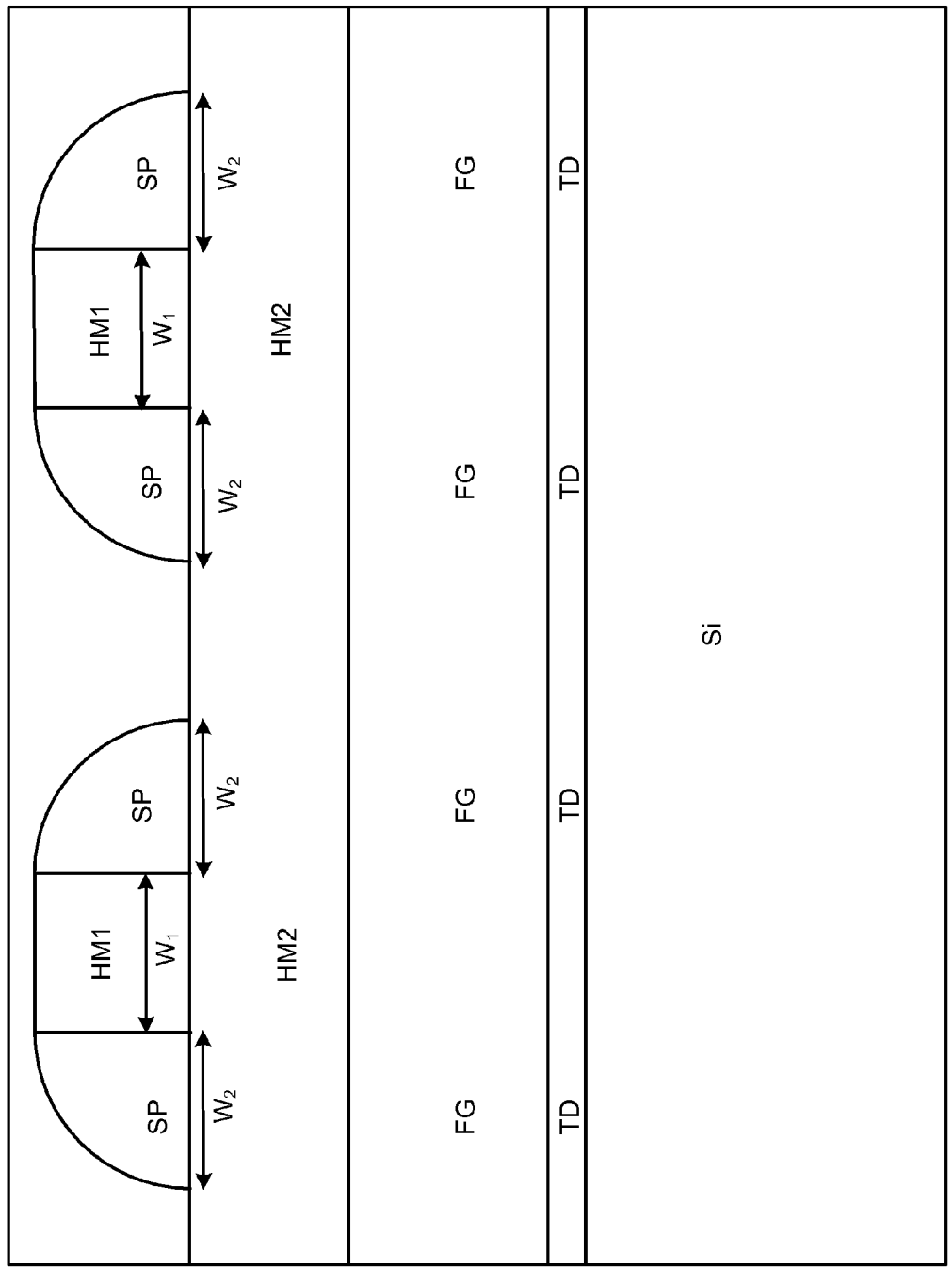
Figure 10:
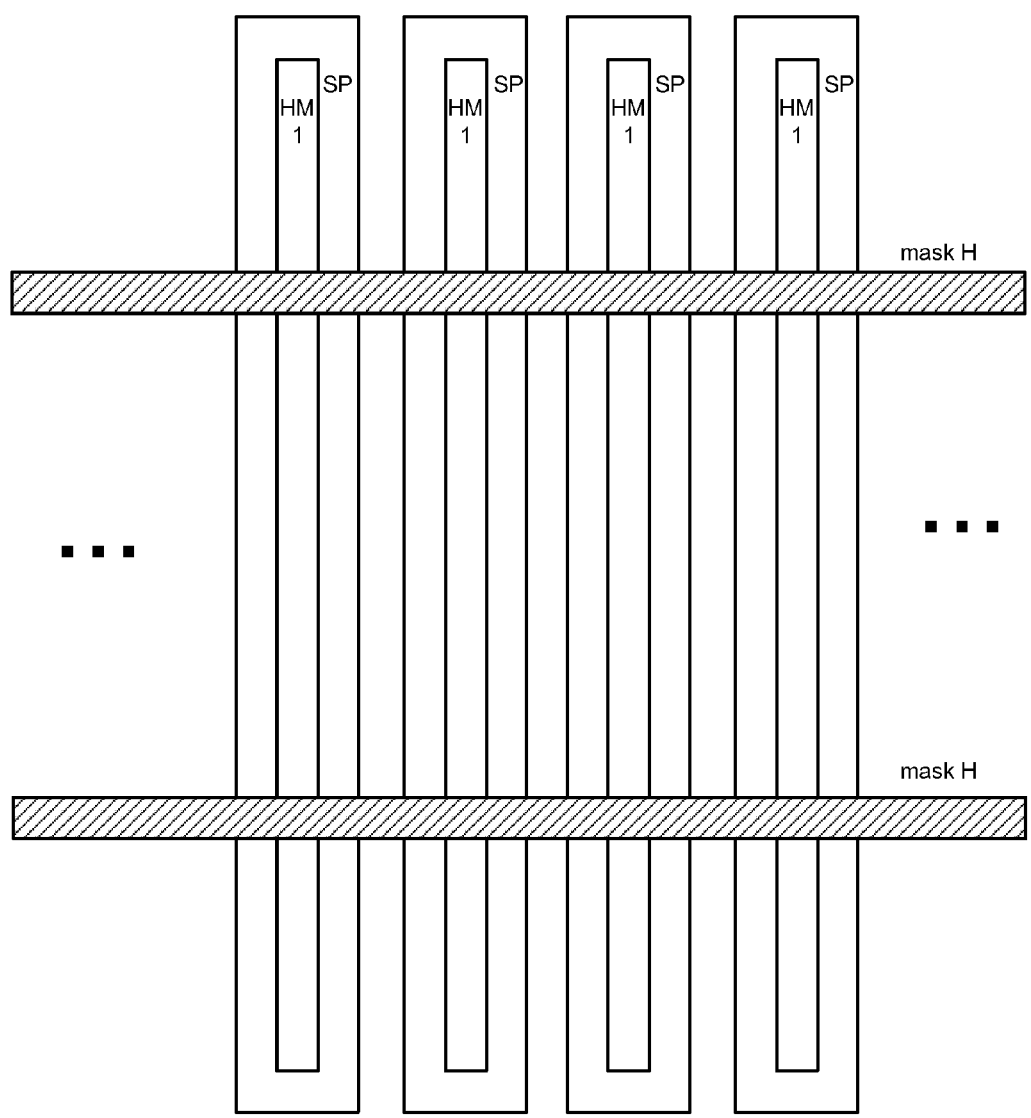

FIG. 6A and FIG. 6B depict a flowchart which describes a portion of one embodiment of a process fabricating a non-volatile storage system using the technology described herein. For ease of discussion, the process of FIGS. 6A and 6B will be described in relation to the embodiment of FIG. 4. However, it will be clear to one of ordinary skill in the art that the process also applies to the embodiment of FIG. 5. FIGS. 7-21 depict a portion of a memory system in various stages of the fabrication process of FIGS. 6A-6B and will be referred to during the discussion of FIGS. 6A-B. FIGS. 7, 8, 9, 11, 12 and 13 depict a cross section taken along dashed line AA of FIG. 4. FIG. 10 provides a top view. FIGS. 14-21 depict a cross section taken along dashed line BB of FIG. 4.

Note that FIGS. 6A and 6B are flowcharts describing only a portion of the front end process for manufacturing of non-volatile storage devices, which covers only steps only as far as forming some of the M1 metal layers. These flows do not cover all of the fabrication steps and one of ordinary skill in the art would understand the additional steps needed. There are many ways to manufacture memory according to the present invention and, thus, it is contemplated that various methods other than that described by FIGS. 6A and 6B can be used. While a flash memory chip will consist of both peripheral circuitry, which includes a variety of low, medium and high voltage transistors, and the core memory, the process steps of FIGS. 6A and 6B are only intended to describe in general terms a possible process recipe for the fabrication of a portion of the core memory array. Many known photolithography, etch, implant, diffusion, and oxidation steps that are intended for the fabrication of the peripheral transistors are omitted.

Figure 7:
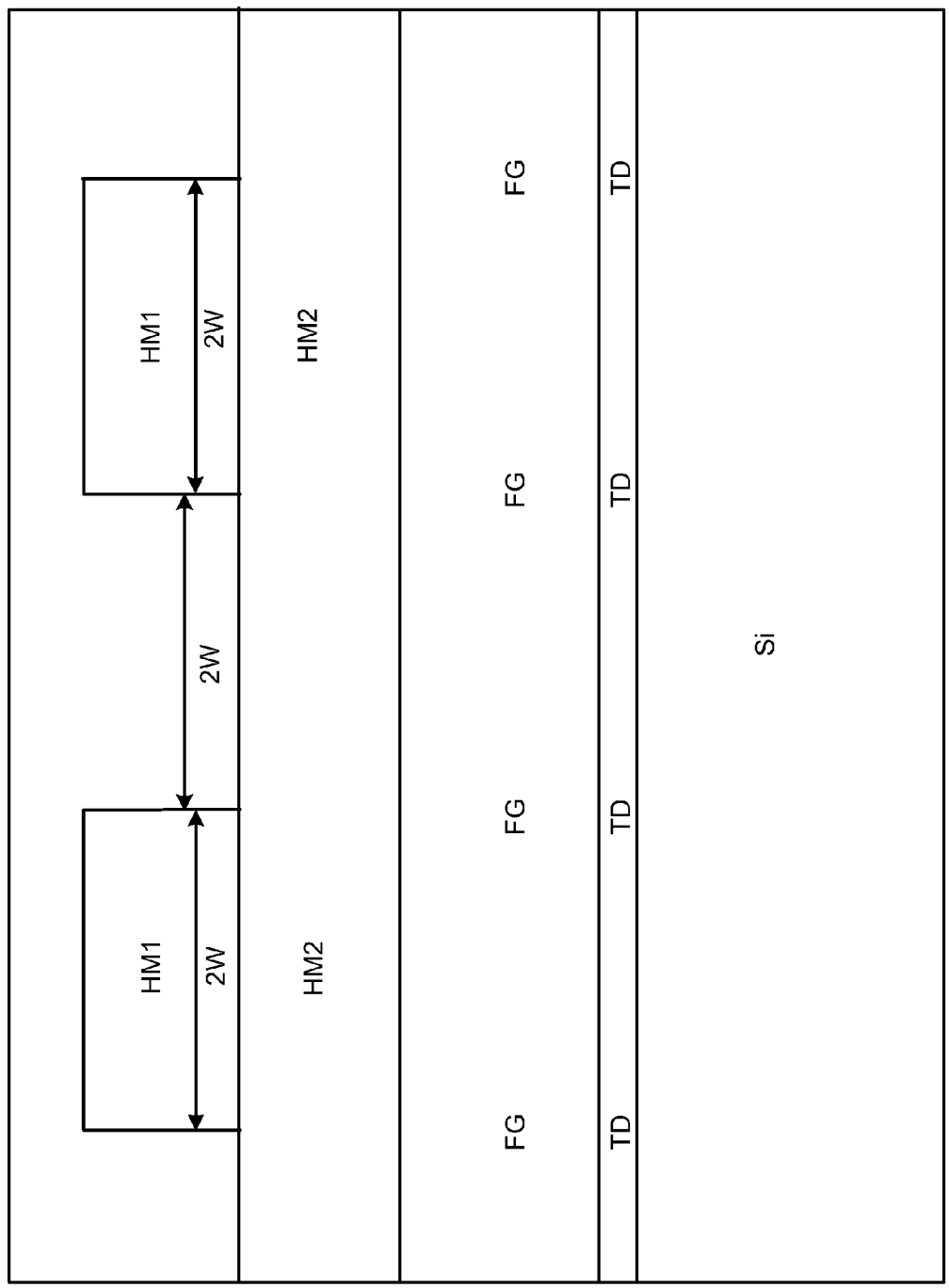
FIGS. 7-21 depicts a portion of a non-volatile storage system being fabricated according to the process of FIGS. 6A-6B.

Step 302 of FIG. 6A includes performing implants and associated anneals of the triple well. The result of step 302 includes a p-substrate, an n-well within the p-substrate and a p-well within the n-well. The n-well depth is typically much thicker than that of the p-well. The p-substrate is usually the thickest consisting of the majority of the wafer thickness. In step 304, a tunnel dielectric layer is deposited on top of the p-well. In one embodiment, the tunnel dielectric is made of $SiO_2$. In step 306, a floating gate layer is deposited over the dielectric layer using CVD, PVD, ALD, or another suitable method. In step 308, one or more hard mask layers (such as $SiO_2$, SiN, $SiO_xN_y$, and carbon oriented materials) are deposited using, for example, a CVD or Spin Coat process. In one embodiment, two hard masks (HM1 and HM2) are deposited over the floating gate layer. In one example implementation, the two hard mask layers include seven layers: (1) silicon on glass (SOG), (2) an Anti-Reflective Coating (ARC) that is organic below the SOG, (3) a high temperature oxide layer below the organic carbon layer, (4) a CVD oriented oxide [e.g., Tetra-ethyl oxide silicate (TEOS) or LP-CVD] layer below the a high temperature oxide, (5) a Silicon Nitride layer below the CVD oriented oxide layer, (6) another CVD oriented oxide layer below the Silicon Nitride layer and (7) another Silicon Nitride layer below the second CVD oriented oxide layer. The top four layers (1)-(4) comprise the top hard mask HM1 and the bottom three layers (5)-(7) comprise the bottom, hard mask HM2. In other embodiments, other structures for one or more hard masks can also be used. In step 310, photoresist and photolithography are used to form strips of the top hard mask HM1 that was deposited in step 308. FIG. 7 shows the results after step 310. As can be seen, the silicon substrate area (Si) is depicted along with the tunnel dielectric layer TD, floating gate layer FG, bottom hard mask HM2 and the strips of top hard mask HM1. In this embodiment, the width of the strips of top hard mask HM1 are 2W. The spacing between top hard masks HM1 is also 2W.

In step 312, a slimming process is performed to reduce the width of the top hard masks HM1 to a width of $W_1$. In some embodiments, $W_1$ is equal to W. In other embodiments, $W_1$ can be smaller or larger than W. In one embodiment the slimming process is performed using $O_2$. In step 314, a conformal layer is deposited on top of the floating gate layer FG and hard mask strips HM1. Based on etch selectivity to hard mask HM1 material, appropriate material can be picked for the conformal layer. FIG. 8 shows a portion of the memory system after step 314, depicting the hard mask HM reduced to a width of $W_1$ and the conformal layer CL deposited on top of the hard mask strips HM. At this point, the spacing between hard mask strips HM is $2W+(2W-W_1)$.

In step 316, spacers are created by performing anisotropic etching in a vertical direction only. The result of step 316 is depicted in FIG. 9, which shows each hard mask strip HM1 surrounded by spacers SP. The spacers 316 have a width of $W_2$. In one embodiment $W_2$ is wider than $W_1$, while in another embodiment $W_2$ is narrower than $W_1$. When the hard mask strips HM1 were formed, they were formed in continuous strips across the entire memory array. FIG. 10 is a top view of a portion of a memory array showing a plurality of hard mask strips HM1 surrounded by spacers SP. In step 317, horizontal strips of hard mask (mask H) are deposited across the hard mask strips HM1, as can be seen in FIG. 10. The areas where horizontal strips of hard mask (mask H) intersect HM1 are the location for the bit line contacts. It is at the bit line contact that two adjacent NAND strings will connect to the same bit line.

Figure 11:
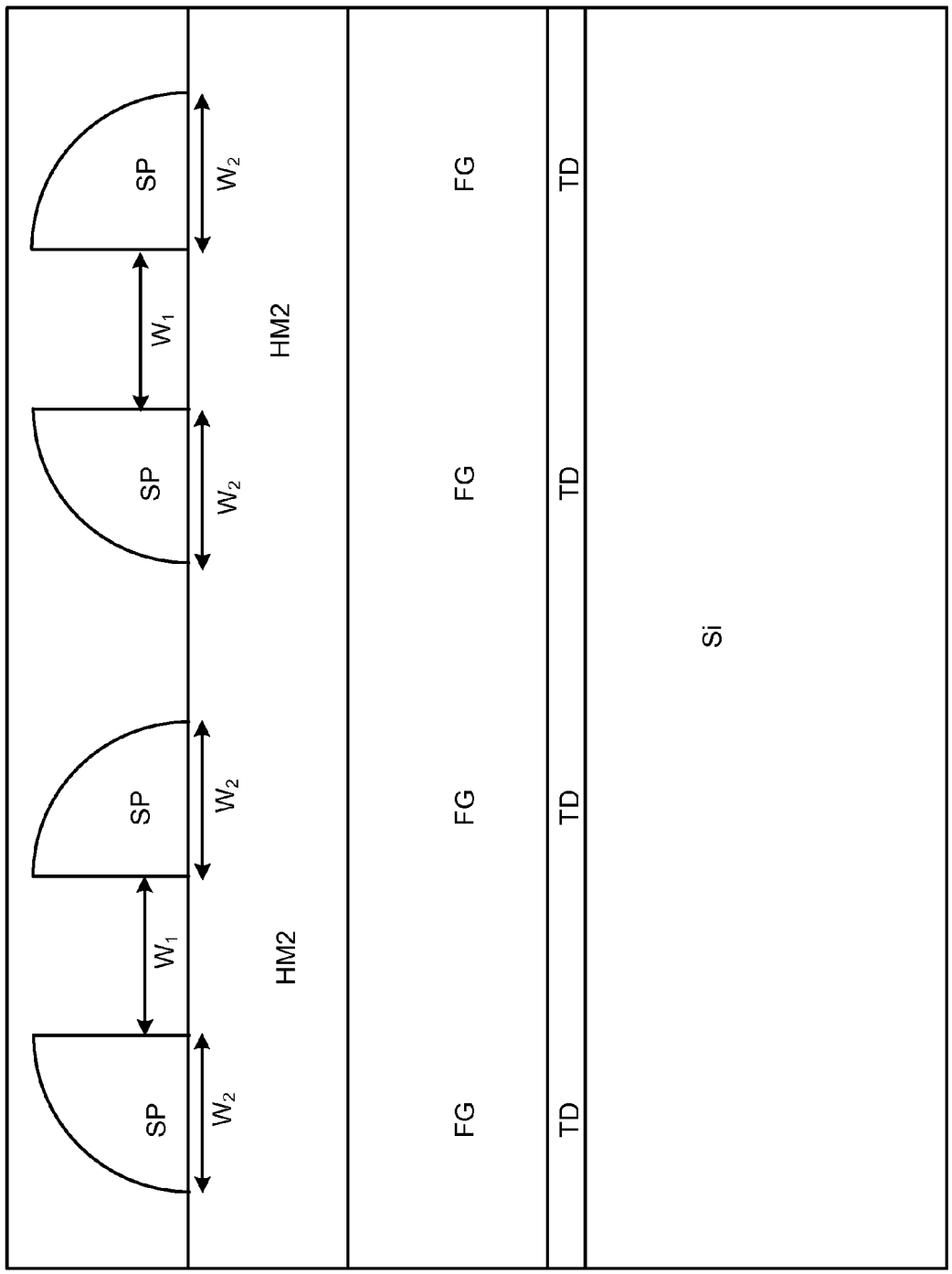
Figure 11A:
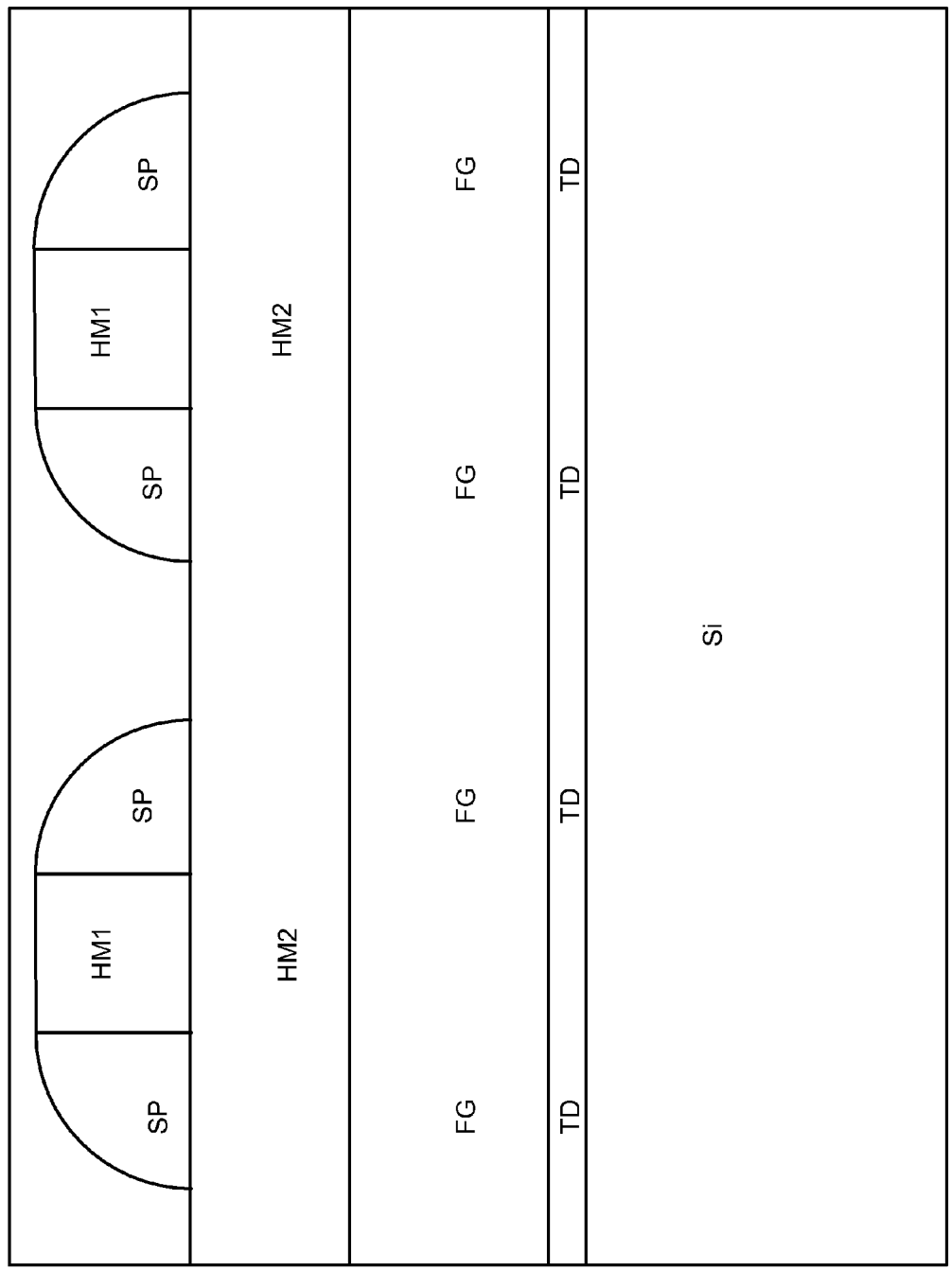
Figure 12:
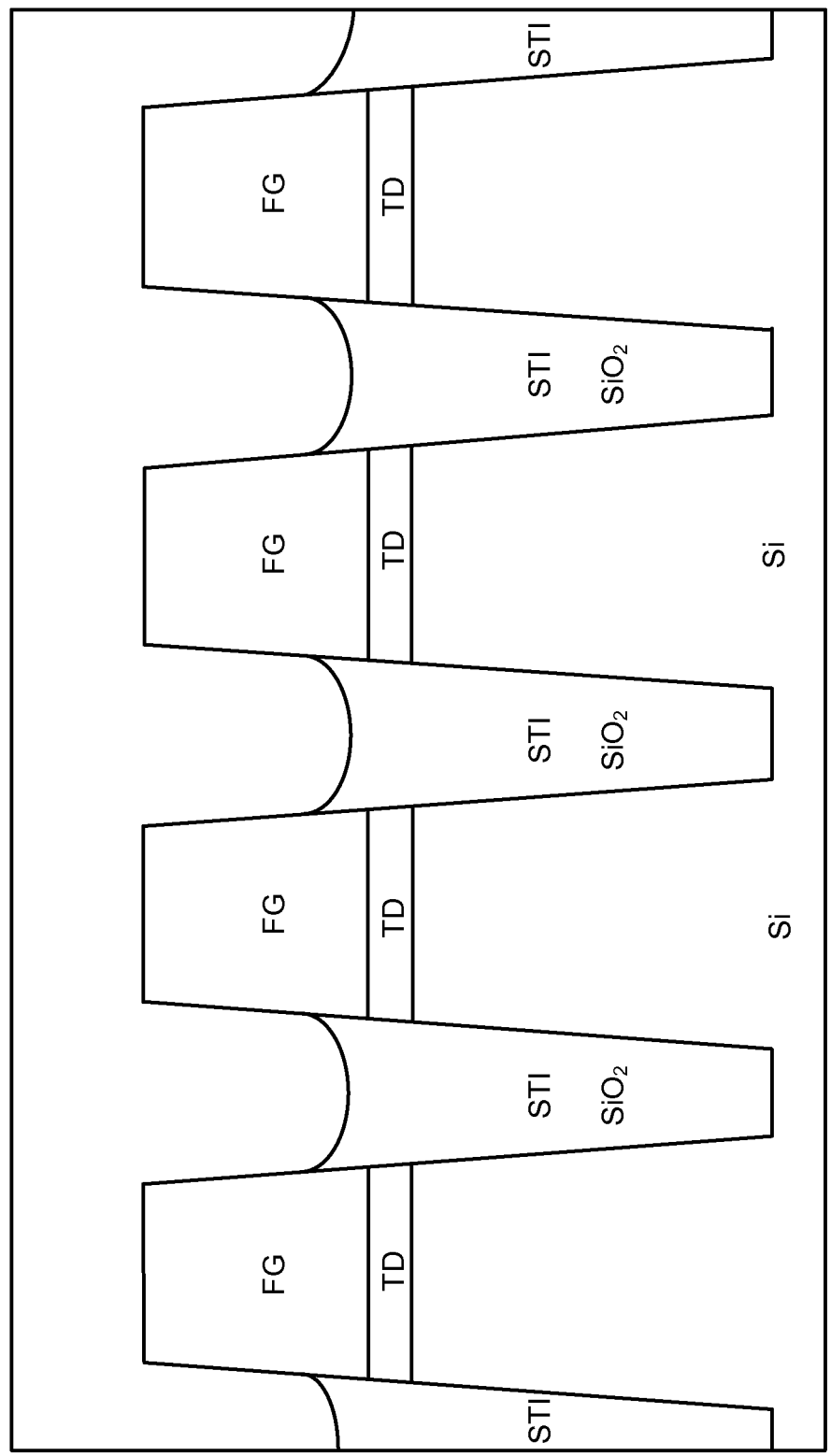
Figure 13:
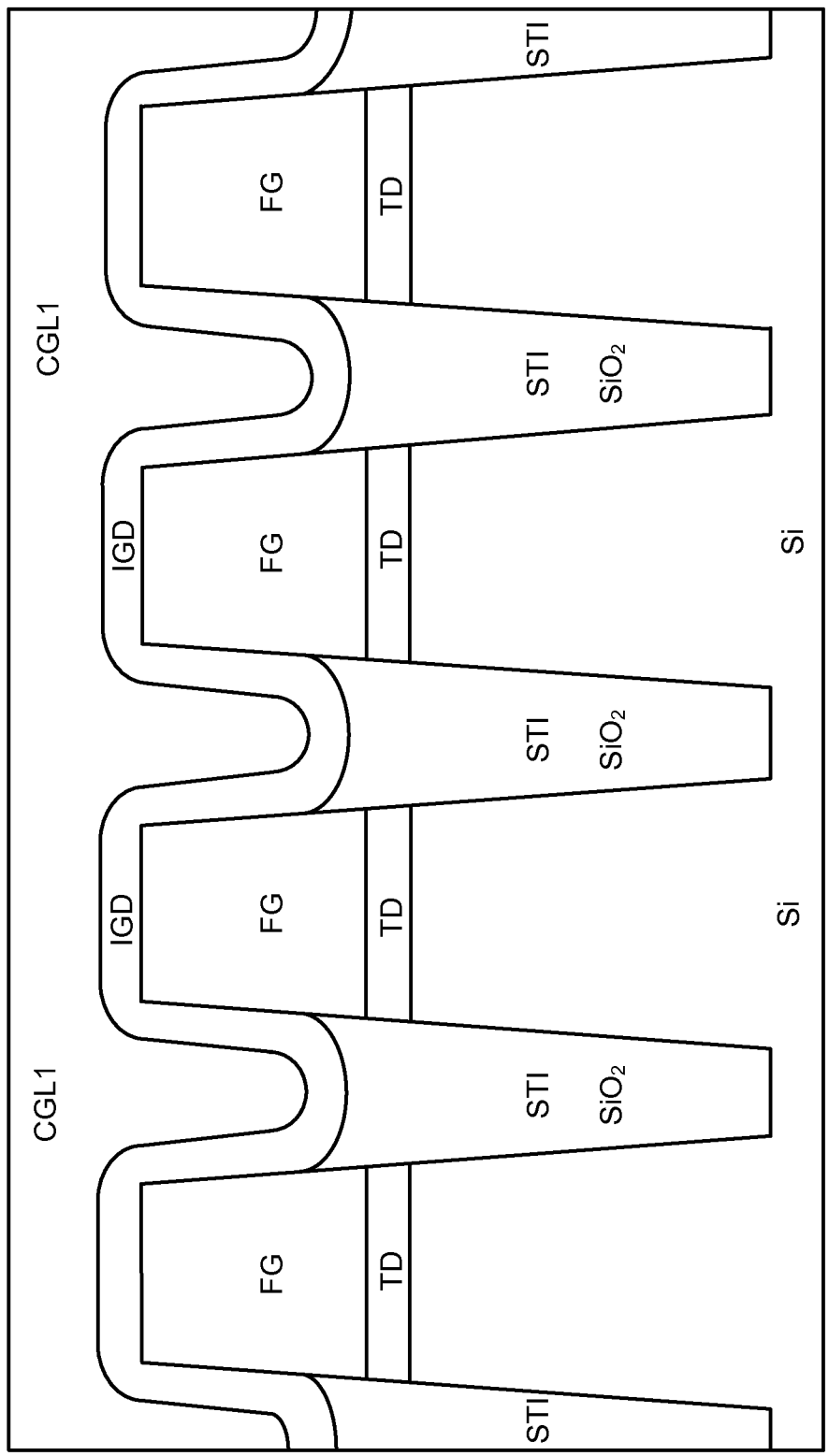

In step 318 of FIG. 6A, the top hard mask HM1 strips are removed using the appropriate wet chemical etch that will remove hard mask strips HM1 but not the spacers SP or mask H. Therefore, the portions of HM1 below mask will not be removed. FIG. 11 depicts the structure after step 318 in a location that is not under mask H so that HM1 was removed. In step 319, horizontal strips of hard mask (mask H) are removed. FIG. 11A depicts the structure after step 319 in a location that was under mask H so that HM1 was not removed. In step 320, a Reactive Ion Etch (RIE) will be used to etch between spacers, through the bottom hard mask HM2, through the floating gate layer, through the tunnel dielectric layer and into the silicon to form shallow trench isolation (STI) areas between spacers. The STI areas are inside the silicon area Si. In step 322, the spacers are removed using any suitable process known in the art. In step 324, the STI areas are filled with oxide. In step 325, the oxide is polished using a chemical mechanical polish process (CMP). In step 326, the bottom hard mask layer is removed using a wet chemical etch (e.g., using $H_3PO_4$). In step 328, the oxide is etched back to remove the oxide down to a level near the top of the tunnel oxide layer TD. The result of step 328 is depicted in FIG. 12, which shows the oxide in the STI up to a level that is a little above tunnel dielectric layer TD. In step 330, the inter-gate dielectric layer is deposited using, for example ALD or CVD process. The inter-gate dielectric layer can be formed by using materials such as $SiO_2$, ONO, $HfO_2$, $Al_2O_3$ or any other high-k material(s) (e.g., not just limited to these), or any combination of such materials. In step 332, a first control gate layer (CGL1) is deposited. In one embodiment, the floating gate layer FG and the first control gate layer CGL1 are both made of polysilicon. The results of step 332 are depicted in FIG. 13 which shows inter-gate dielectric layer IGD and the first control gate layer CGL1. After step 332, the process continues at step 334 FIG. 6B.

Figure 14:
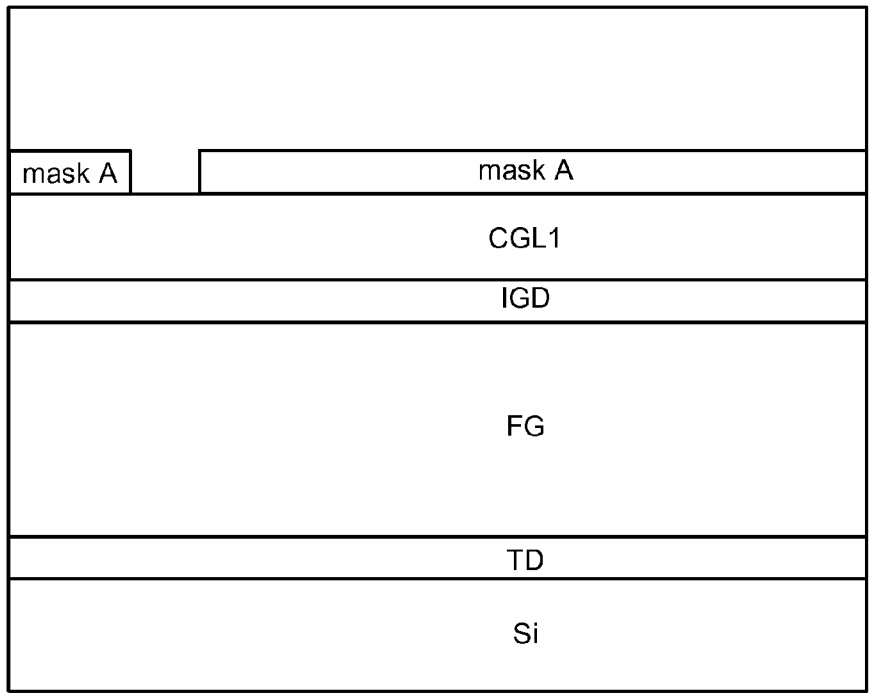
Figure 15:
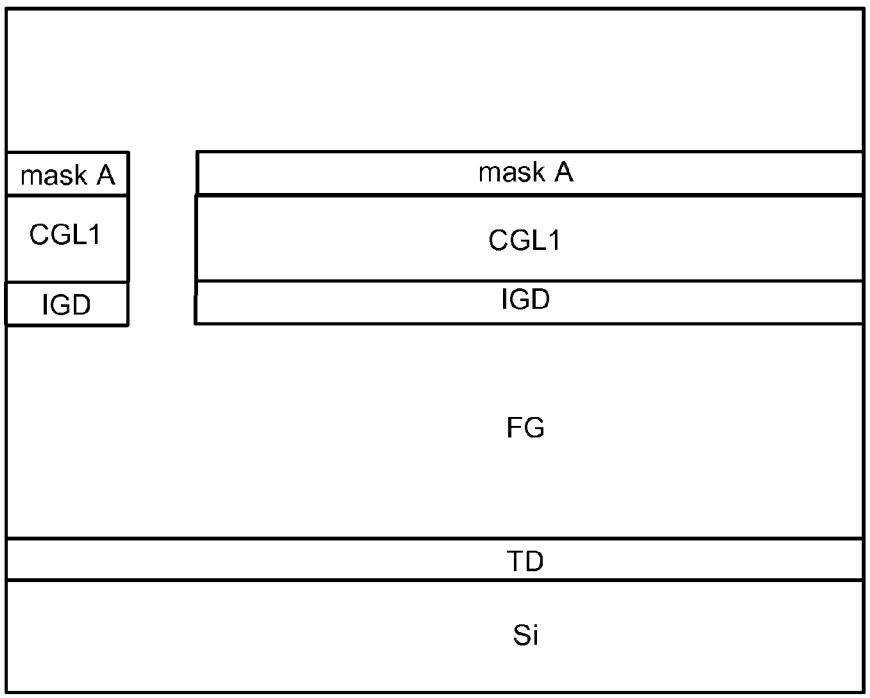

In step 334 of FIG. 6B, a mask is deposited and patterned. The mask is referred to in the drawings as Mask A. The purpose of the mask is to selectively create shorts (via an aperture or passageway in the inter-gate dielectric IGD) within the drain side select gates of the NAND strings. This mask also creates shorts (via an aperture or passageway in the inter-gate dielectric IGD) within the source side select gates of the NAND strings. These shorts are not created in the memory cells used for storing data. Thus, the mask will have an opening where there should be a passageway from control gate layer 1 CGL1 to floating gate layer FG through inter-gate dielectric IGD. The results of step 334 are depicted in FIG. 14 which shows Mask A deposited above control gate layer 1 CGL1. Note that FIG. 14 is in a different perspective than FIGS. 7-13. As discussed above, FIG. 14 shows a perspective along line BB of FIG. 4.

Figure 16:
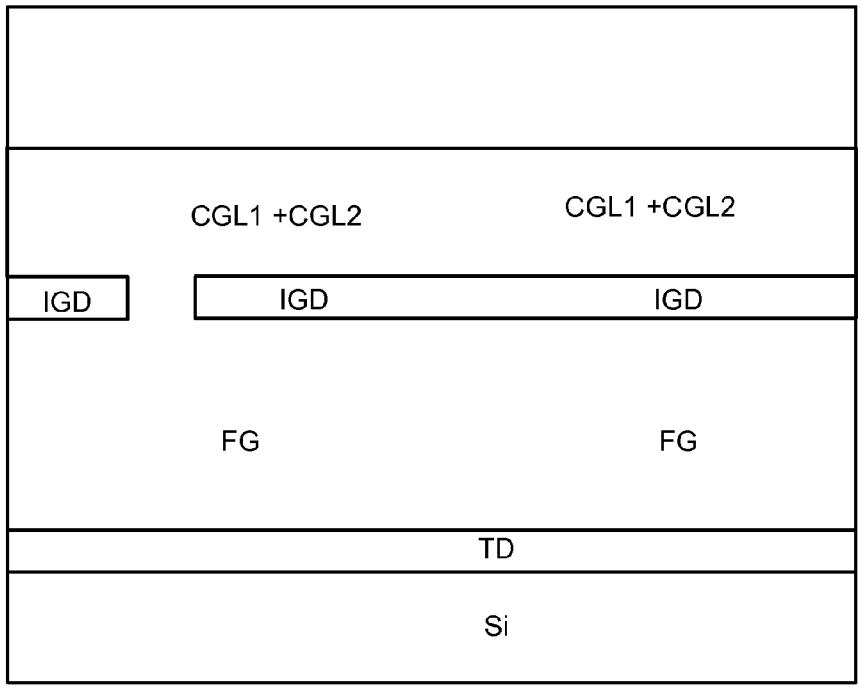

In step 336 of FIG. 6B, an etching process will be performed using RIE to etch through CGL1 and IGD, as well as a little bit into floating gate layer FG. As can be seen from FIG. 15, the etching is performed in the gaps of Mask A and a passageway is created from CGL1 through IGD to FG. In step 338, Mask A is removed using any suitable process known in the art. In step 340, a second control gate layer is deposited. The second control gate layer is depicted in FIG. 16 as CGL2. Thus, CGL1 and CGL2 together form the control gate. When second control gate layer CGL2 is deposited, it will fill in the passageway created during step 336 so that the control gate layer (CGL1+CGL2) will be in electrical communication (and in electrical contact) with floating gate layer FG.

In one embodiment, FG, CGL1 and CGL2 will be made of the polysilicon. Other materials can also be used. In another embodiment, the three layers FG, CGL1 and CGL2 can be made of different materials from each other. When floating gate layer FG, control gate layer 1 CGL1 and control gate layer CGL2 are all made of conductive materials, and the control gate and floating gate are shorted together, the selection gate will not operate as a non-volatile memory cell.

Figure 17:
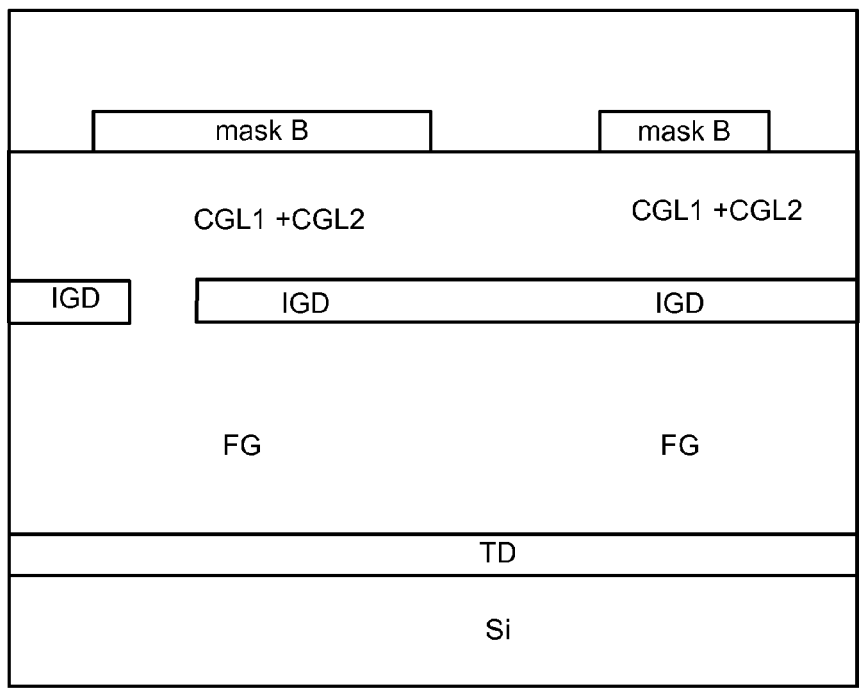
Figure 18:
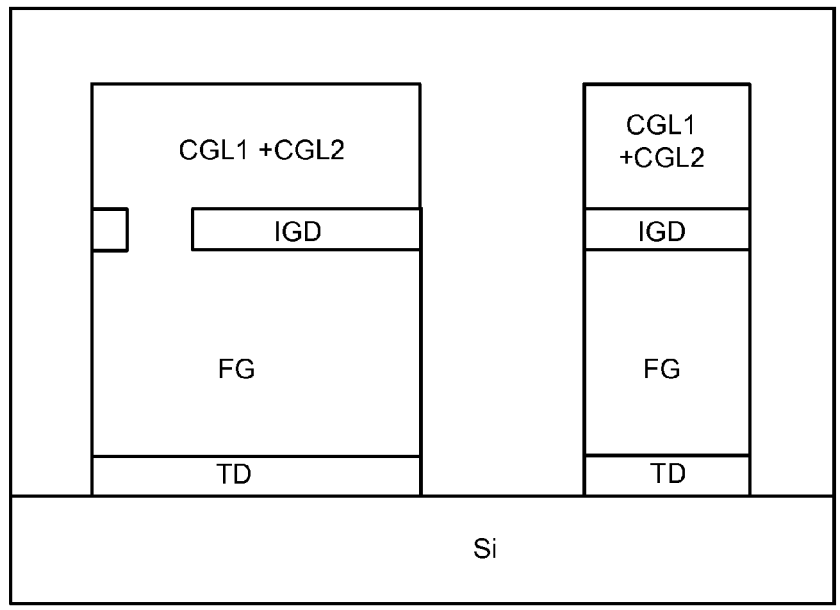

In step 342, another mask is patterned. This mask is referred to in the drawings as Mask B. The purpose of Mask B is to define the word lines. FIG. 17 shows the results of step 342 with Mask B deposited over the structure depicted in FIGS. 14-17. In FIG. 18, an etching process (e.g. RIE) is performed down to the substrate. Therefore, the etching process will remove portions of CGL1+CGL2, IGD, FG and TD. This step will break up the strips of active area of a NAND string into separate memory cells and also will divide CGL1+CGL2 into separate word lines. The control gate layer for a memory cell is the same material as a portion of the word line. In step 346, Mask B is removed. The results at step 346 are depicted in FIG. 18. As can be seen, above the silicon Si are two gate stacks. The gate stack on the right includes CGL1+CGL2, IGD, FG and TD. This stack is one of the memory cells (e.g. dummy memory cell or data memory cell connected to the end word line). The stack on the left includes CGL1+CGL2, IGD, FG and TD (with CGL1+CGL2 in communication with FG through a passageway that runs through IGD), and corresponds to the selection gate.

Figure 19:
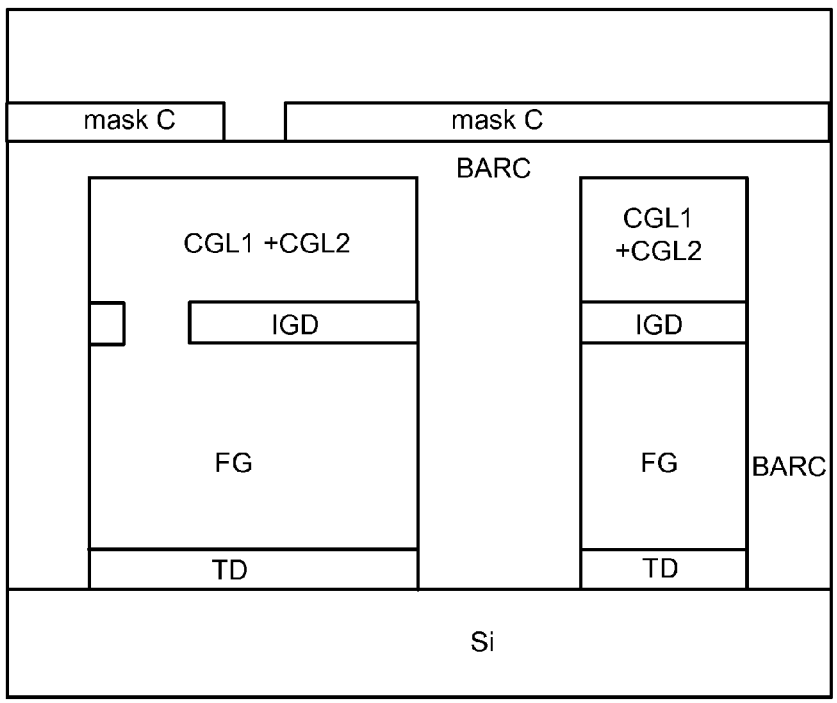

In step 348, BARC (Bottom Anti-Reflective Coating) is added to fill the gaps, and another mask is deposited and patterned. This mask is referred to as Mask C in the drawings. The purpose of this Mask C is to define the two selection lines SGDO and SGDE. The results of step 348 as depicted in FIG. 19, which shows Mask C deposited on top of the structure of FIG. 18.

Figure 20:
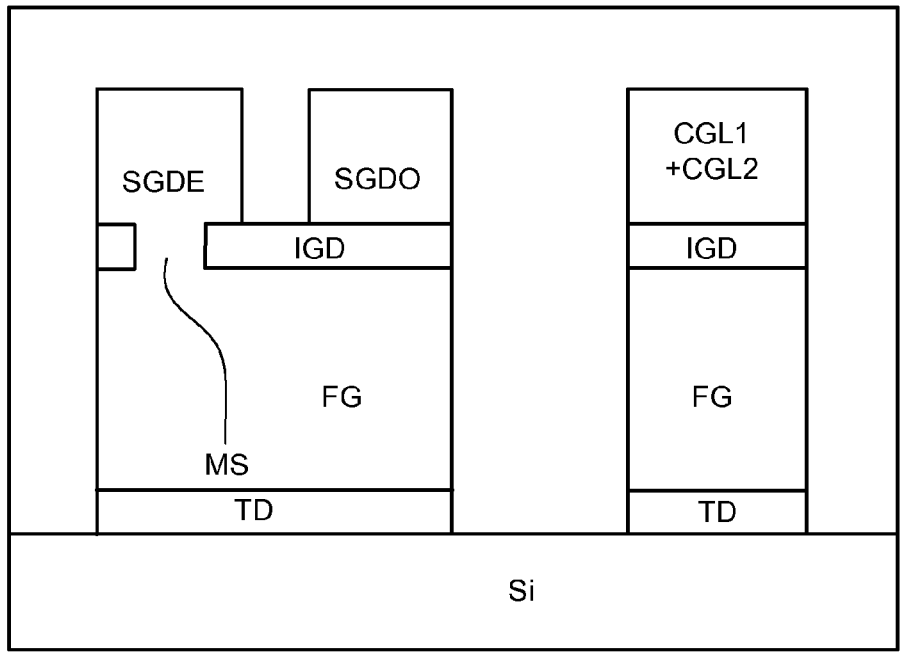

In step 350, an etching process using RIE will be performed to etch through the appropriate portions of CGL1+CGL2 (and BARC) down to inter-gate dielectric layer IGD. In step 352, Mask C and the BARC will be removed. The results of step 352 are depicted in FIG. 20. As can be seen, the layer of CGL1+CGL2 for the selection gate has been cut into two sections: one is a section that corresponds to SGDE and the other section corresponds to SGDO. In this embodiment, SGDE is an electrical contact and communication with floating gate layer FG through the passageway MS. SGDO is electrically insulated from floating gate layer FG by inter-gate dielectric layer IGD.

Figure 21:
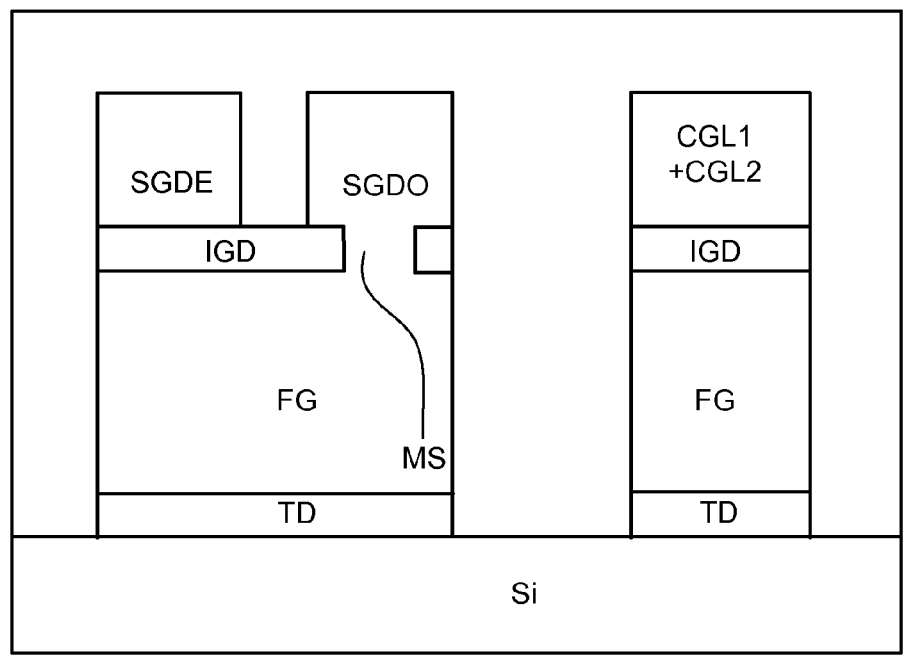

Looking back at FIG. 4, it's noted that every other NAND string will be connected electrically to either SGDE or SGDO. Thus, the selection transistor of FIG. 20 corresponds to selection transistor 220 of FIG. 4. FIG. 21 shows the structure of selection transistor 222 of FIG. 4. In this case, the shape of Mask A (steps 334-338, in FIGS. 14-15) is patterned so that passageway MS is on the other side of IGD; therefore, SGDO is an electrical connection and communication with floating gate layer FG while SGDE is electrically insulated from floating gate layer FG by inter-gate dielectric IGD.

In step 354 of FIG. 6B, the source/drain regions of the NAND string are created using implantation, as performed and known in the art. The source/drain regions can also be annealed, as known in the art. In step 356, the bit line contacts are created. In step 358, an insulator is added between SGDE and SGDO. In one embodiment, the insulator is SiO$_2$. In another embodiment, SiN, SiO/SiN combination or Air-gap formation can be used. In step 360, the appropriate metal and signal lines are added to the memory. In step 362, additional processing is performed to include the relevant support circuits and the necessary devices.

As discussed above, the proposed new structure includes neighboring NAND strings connected to a common bit line. Each NAND string will only have one drain side selection gate; however, the control gate layer at each of those drain side select gates are broken up into two regions that are insulated from each other. Only one of those two regions will be in electrical communication and in electrical contact with the floating gate layer via a short (passageway or aperture). Thus, while both control gate layers (and the control gate layers form part of the selection lines) will be in physical contact with the selection transistor, only one of those two control gate regions will be an electrical contact and in electrical communication with the floating gate regions FG. By using only one selection transistor, space can be saved. Because less bit lines are used, less bit line contacts can be used which will reduce memory array size.

FIG. 22A provides a top perspective of a portion of the structure of FIG. 4. For example, FIG. 22A shows the contact for bit line 200 and the contact for bit line 202, as well as the selection signal lines SGDE and SGDO. FIG. 22A shows the active areas AA for the four NAND strings 210, 212, 214 and 216, as well as the floating gate regions FG that correspond to the floating gate regions FG depicted in FIGS. 20 and 21. FIG. 22A also shows the passageway or aperture MS.

Figure 22B:
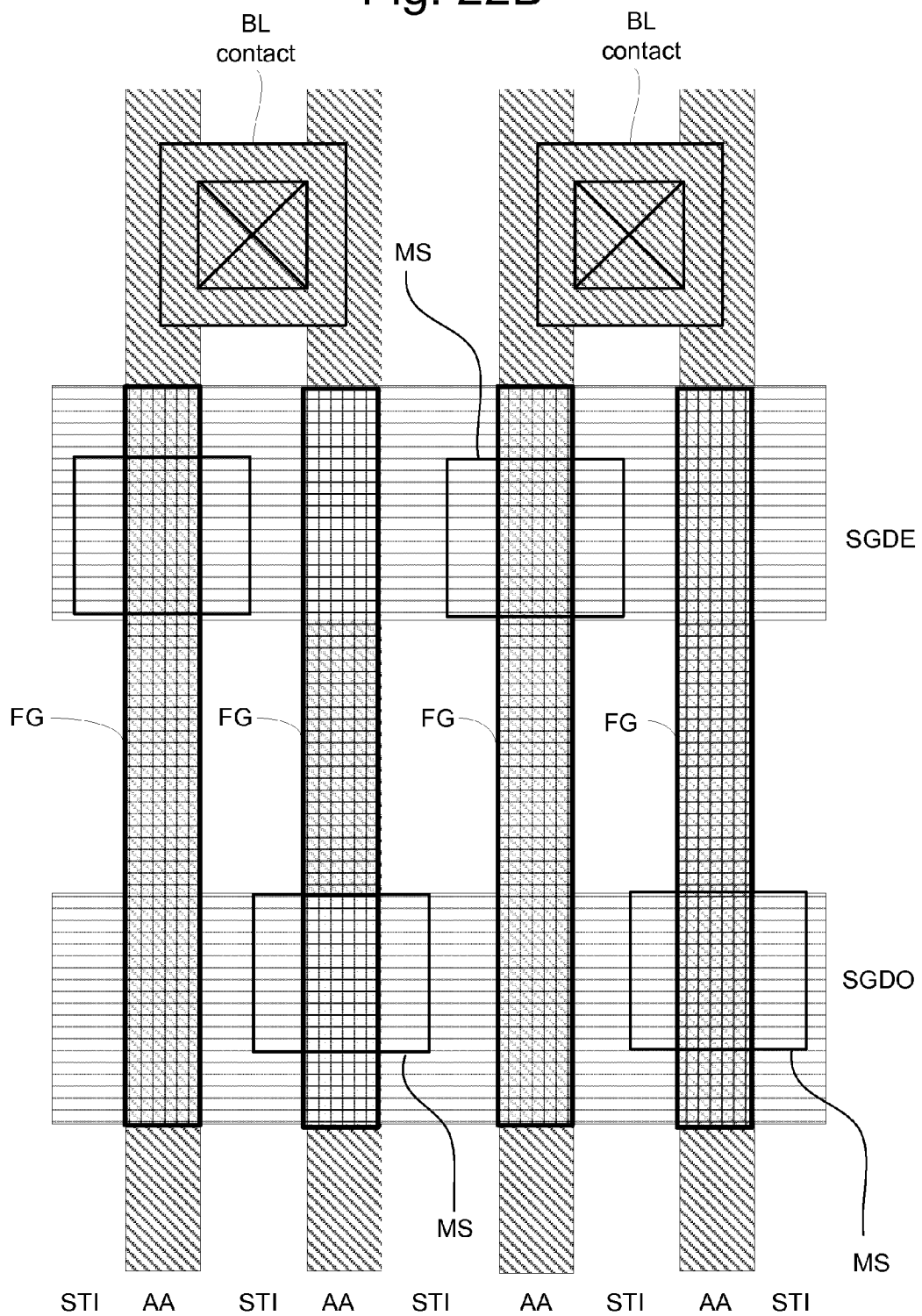

FIG. 22B shows another embodiment of the structure of FIG. 4. Here the etch back step 328 is performed around the memory cells but is not performed or reduced around the drain side select gate such that the oxide that fills the STI region is at a higher level around the drain side select gate transistor area, thereby, reducing the overlay margins between the edge of the passageway MS and the appropriate control gate portion (SGDO or SGDE). That is, the passageway MS could be at the edge of the control gate region rather than in the middle (as depicted in FIG. 20). Not etching back in the select gate drain regions will help with bringing MS to the edge or beyond the edge of the control gate in the region between SGDE and SGDO, but is not a requirement. Another advantage of not etching back is that not etching back reduces the capacitance between the signal line and the floating gates of odd SGD transistors that do not connect to SGDE. The same holds true for SGDO signal line as well. Another advantage of not etching back is reducing the capacitance between the SGDO signal line and the SGDE signal line. This is illustrated in FIG. 22C which shows a cross section across multiple NAND strings, with the top cross section showing the case of the etch back being performed to the drain side selection gate and the bottom cross section showing the drain side selection gate without the etch back as discussed above.

FIG. 22D depicts another embodiment of the structure of FIG. 4. When etching in step 350, it may be possible to etch the signal lines SGDE and SGDO narrower in the case when the etching process can selectively etch CGL1 and CGL2, without etching FG. In one example, this can be performed by having CGL1 and CGL2 comprise a first conductive material and the FG layer comprise a different conductive material (rather than have CGL1, CGL2 and FG be of the same conductive material as described above).

Figure 22E:
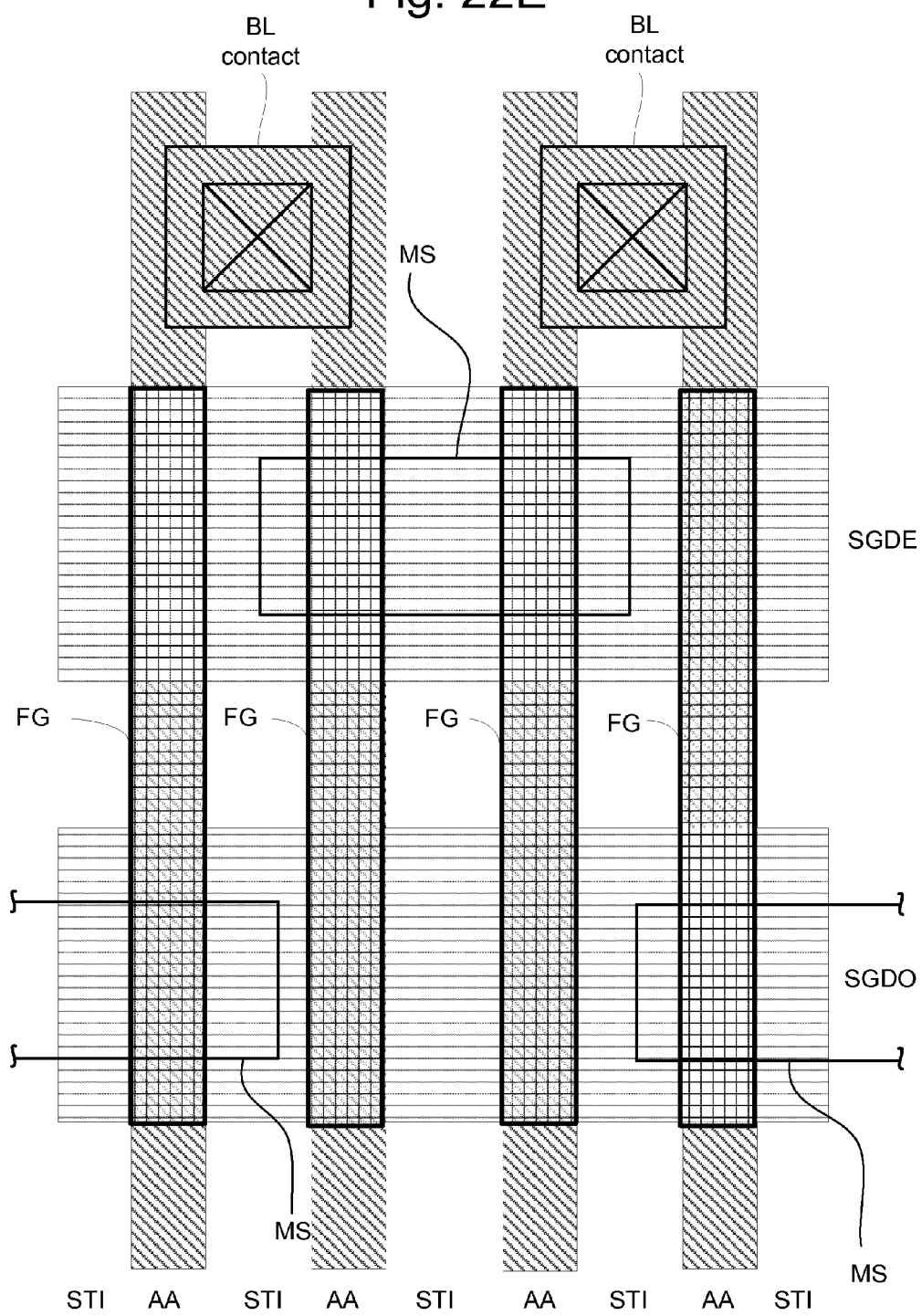
Figure 22F:
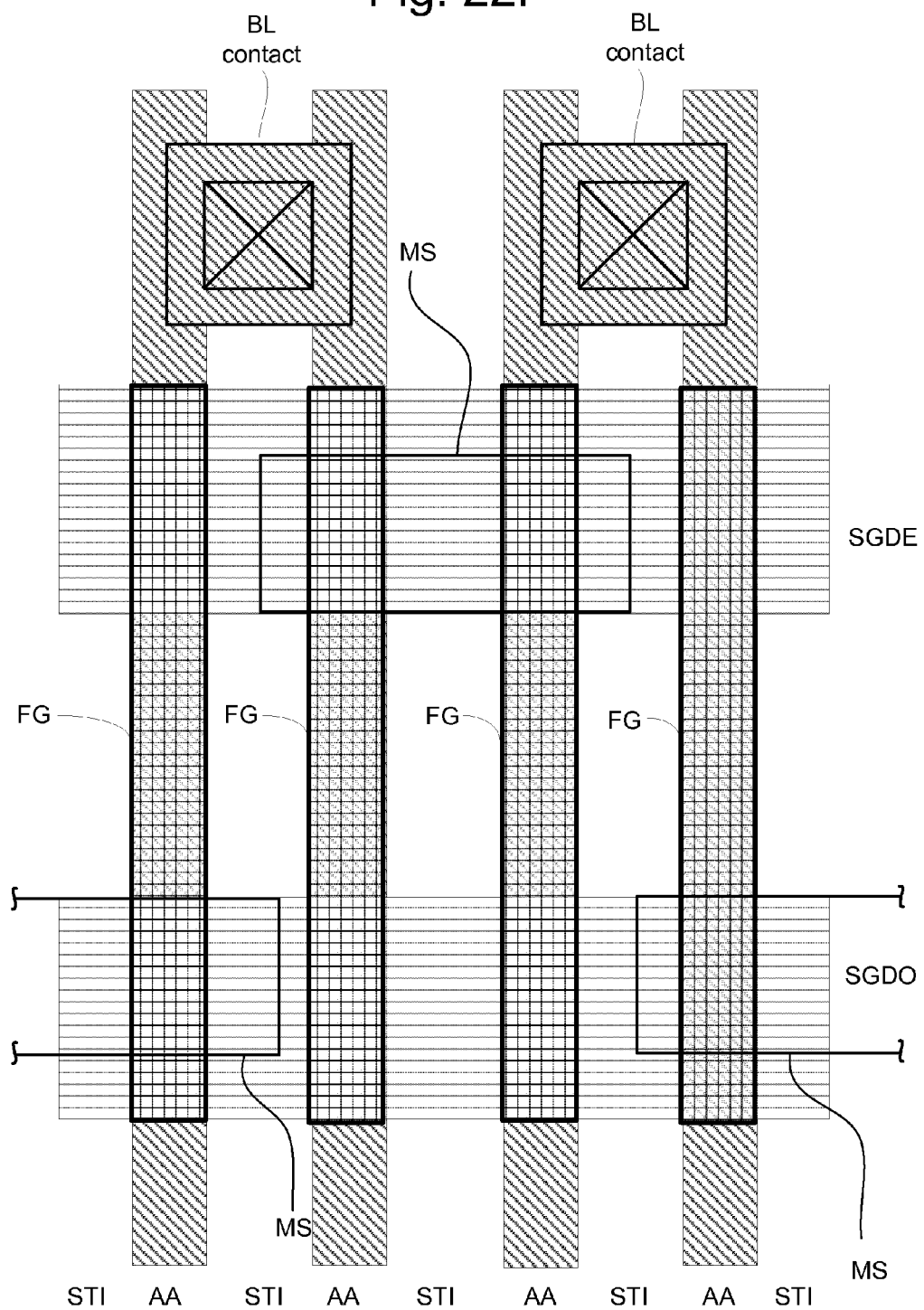
Figure 22G:
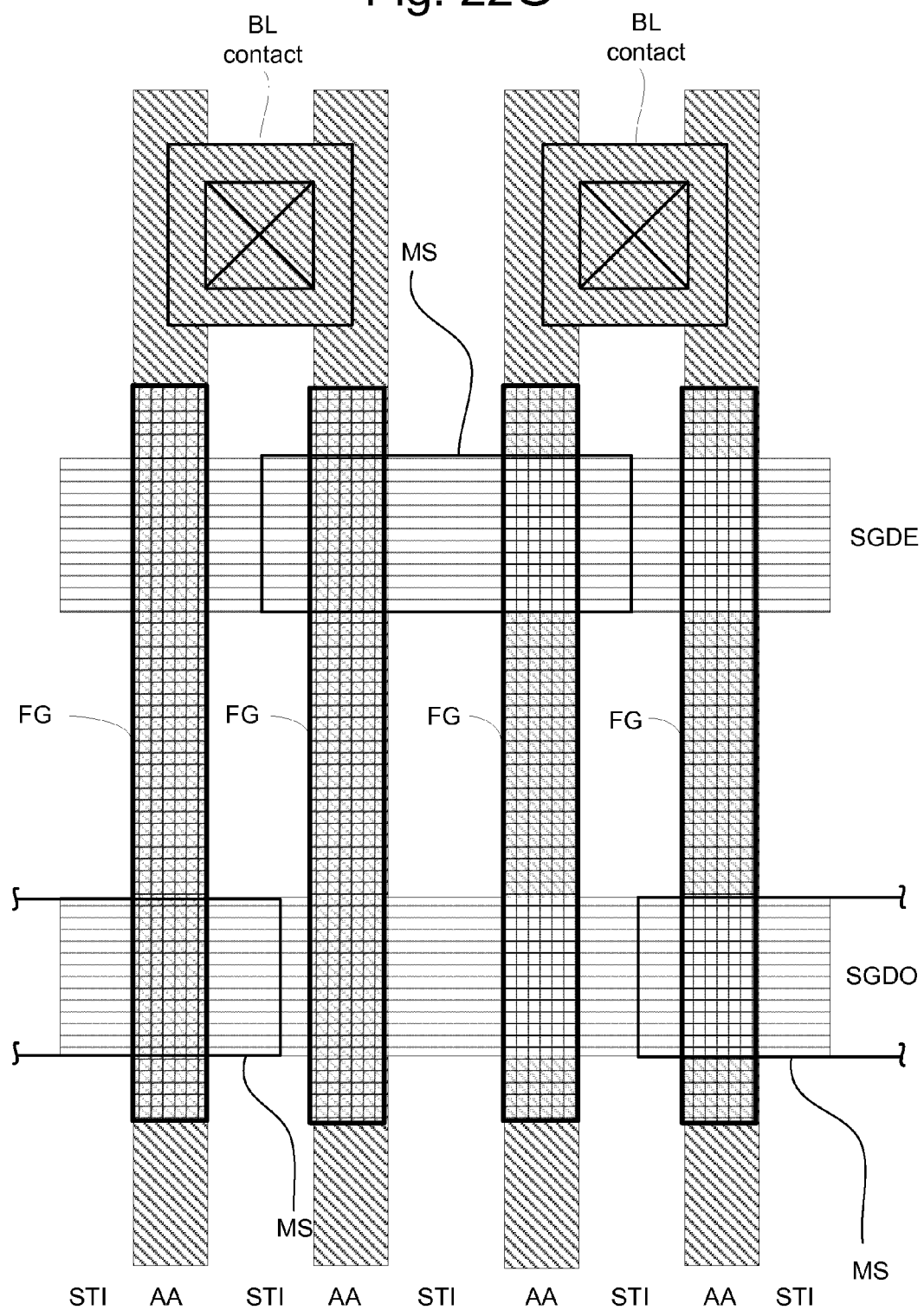

FIG. 22E is a top view of a portion of the structure of FIG. 5. FIG. 22F is a top view of a portion of the structure of FIG. 5 for an embodiment in which the etch back step 328 is not performed or is reduced around the drain side select gate such that the oxide that fills the STI region is at a higher level around the drain side select gate, thereby, reducing the overlay margins between the edge of the passageway MS and the appropriate control gate portion (SGDO or SGDE). FIG. 22G is another embodiment of the structure of FIG. 5 in which the signal lines SGDE and SGDO are etched narrower in the case when the etching process can selectively etch CGL1 and CGL2, without etching FG.

Figure 23:
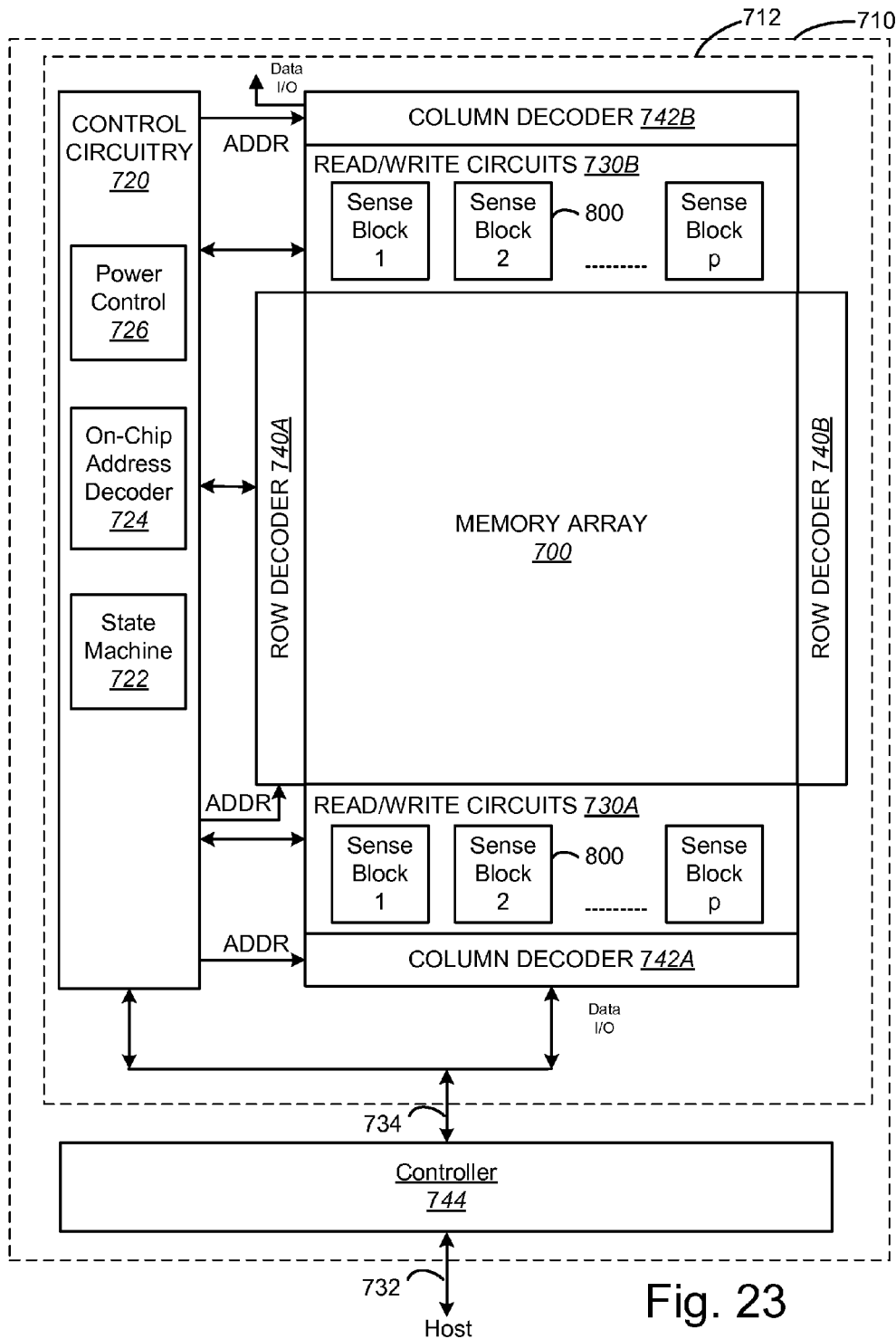
FIG. 23 is a block diagram of a non-volatile memory system.

FIG. 23 illustrates a memory device 710 having read/write circuits for reading and programming a page (or other unit) of memory cells (e.g., NAND multi-state flash memory) in parallel, including memory cells on NAND strings sharing bit lines as described above. FIG. 23 depicts the Sense Blocks 800, Column decoder 742 and READ/WRITE Circuits 730 on both sides of memory array. With this shared bit line architecture described herein, since the number of sense blocks is halved, one embodiment can include sense blocks, Column decoder and Read/Write circuits on only one side of memory array. This can lead to further reduction of chip size. Memory device 710 may include one or more memory die or chips 712. Memory die 712 includes an array (two-dimensional or three dimensional) of memory cells 700, control circuitry 720, and read/write circuits 730A and 730B. In one embodiment, access to the memory array 700 by the various peripheral circuits is implemented in a symmetric fashion, on opposite sides of the array, so that the densities of access lines and circuitry on each side are reduced by half. The read/write circuits 730A and 730B include multiple sense blocks 800 which allow a page of memory cells to be read or programmed in parallel. The memory array 700 is addressable by word lines via row decoders 740A and 740B and by bit lines via column decoders 742A and 742B. Word lines and bit lines are examples of control lines. In a typical embodiment, a controller 744 is included in the same memory device 710 (e.g., a removable storage card or package) as the one or more memory die 712. Commands and data are transferred between the host and controller 744 via lines 732 and between the controller and the one or more memory die 712 via lines 734.

In another embodiment, the system can include sense blocks, Column decoder and Read/Write circuits on both sides of the array where an array of N NAND strings will have N/2 bit lines, and N/4 bit lines are connected to sense blocks, Column decoder and Read/Write circuits at the top of the array and N/4 bit lines are connected to sense blocks, Column decoder and Read/Write circuits at the bottom of the array.

Control circuitry 720 cooperates with the read/write circuits 730A and 730B to perform memory operations on the memory array 700. The control circuitry 720 includes a state machine 722, an on-chip address decoder 724 and a power control module 726. The state machine 722 provides chip-level control of memory operations. The on-chip address decoder 724 provides an address interface between that used by the host or a memory controller to the hardware address used by the decoders 740A, 740B, 742A, and 742B. The power control module 726 controls the power and voltages supplied to the word lines and bit lines during memory operations. In one embodiment, power control module 726 includes one or more charge pumps that can create voltages larger than the supply voltage.

In one embodiment, one or any combination of control circuitry 720, power control circuit 726, decoder circuit 724, state machine circuit 722, decoder circuit 742A, decoder circuit 742B, decoder circuit 740A, decoder circuit 740B, read/write circuits 730A, read/write circuits 730B, and/or controller 744 can be referred to as one or more managing circuits. The one or more managing circuits perform the processes for erasing, programming and reading.

In one embodiment, an array of memory cells 700 is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used. A block contains a set of NAND strings which are accessed via bit lines and word lines. Typically, all of the NAND strings in a block share a common set of word lines.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. Thus, in one embodiment, the set of memory cells that are connected to a common word line are programmed simultaneously. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

The operation of the structure described above is very similar to the operation of prior art flash memory. For example when reading memory cells, any suitable processing known in the art can be utilized. The deviation from processes known in the art are due to the presence of two select gate signals. If reading memory cells on NAND strings electrically connected to SGDE, then SGDE should be set at a voltage that turns on the selection gate (should use a voltage that is greater than the threshold voltage of selection gate, e.g., three volts) and SGDO should be set at zero volts to cut off those NAND strings that are electrically connected to SGDO. If reading memory cells connected on NAND strings electrically connected to SGDO, then SGDO receives the voltage to turn on the selection gate (e.g. three volts) and SGDE is set at zero volts to cut off the other NAND strings. The rest of the signals operate the same as is known in the art. When performing an erase operation, SGDE, SGDO, SGS, bit lines and source lines are floating. All word lines in a selected block are grounded. The p-well is provided with an appropriate erase voltage. Other erase schemes in the existing art can also be used.

FIG. 24 is a table describing one embodiment of a process for programming using the structure of FIG. 4 or FIG. 5. FIG. 24 shows voltages applied during six successive time periods for the example of programming even NAND stings (and not odd NAND strings) with data that causes NAND string 210 to be programmed and NAND string 214 to be inhibited from being programmed. FIG. 24 shows voltage values for the bit line 200 (BL200), Bit line 202 (BL202), SGDE, SGDO, the selected word line WLn (in this example, is WLn=2), unselected word lines (WLn#2) and the source side selection signal SGS. During time period T1, all signals are at 0 volts. During T2, BL200, BL202, SGDE and SGDO are set at Vdd, while all word lines (WLn=2 and WLn#2) are at Vpass (e.g., ~7-10 volts). Various existing boosting schemes which employ application of different voltages on unselected word lines can also be used. SGS remains at 0v. All NAND strings are pre-charged and boosted during T2. At time T3, SGDO is changed to 0v, so that odd NAND strings (e.g., NAND strings 212 and 216) are cut off and will retain the boosting charge in the channels of the memory cells. At time T4, even NAND strings (e.g., NAND strings 210 and 214) are selectively unboosted. That is, those NAND strings that are to receive programming (e.g., 210) lose their boosting charge in the channel areas by lowering the bit line voltage to 0 volts, while those NAND strings (e.g., 214) that are not to receive programming will retain their boosting. In some embodiments, SGDE is lowered from Vdd (e.g., 2.6-3v) to Vsgd (e.g., ~2.2 v) to reduce boosting leakage from drain side select gate. At time T5, the programming voltage Vpgm is applied to the selected word line WLn=2 as a voltage pulse. At time T6, the voltages are returned to 0v. In some implementations, the process of FIG. 24 is repeated multiple times during programming of data. In one embodiment, each iteration of the voltages depicted in FIG. 24 (e.g., iterations of T1-T6) will include a voltage pulse for Vpgm that is higher in magnitude than the previous voltage pulse for Vpgm so that the programming voltage is applied as a series of stepped pulses. Between the pulses, verify operations are performed.

FIG. 25 is a table describing one embodiment of a process for programming using the structure of FIG. 4 or FIG. 5. FIG. 25 shows voltages applied during six successive time periods for the example of programming even NAND stings (and not odd NAND strings) with data that causes NAND string 210 to be programmed and NAND string 214 to be inhibited from being programmed. FIG. 25 shows voltage values for BL200, BL202, SGDE, SGDO, WLn=2, WLn≠2 and SGS. During time period T1, all signals are at 0 volts. During T2, BL200, BL202, SGDE and SGDO are set at Vdd, while all word lines (WLN=2 and WLN≠2) are at 0 volts. However, some or all word lines can be at a different voltage condition ($V_1$). SGS remains at 0v. All NAND strings are pre-charged during T2. At time T3, SGDO is changed to 0v and BL200 is changed to 0v, so that odd NAND strings and even NAND strings that will not be programmed will retain the pre-charge in the channels of the memory cells. At time T4, Vpass is applied to all word lines so that all odd word lines and all even word lines that will not receive programming will be boosted. SGDE is changed to Vsgd. At time T5, the programming voltage Vpgm is applied to the selected word line WLn=2 as a voltage pulse. At time T6, the voltages are returned to 0v. In some implementations, the process of FIG. 25 is repeated multiple times during programming of data. Between the pulses (e.g., between iterations of the process of FIG. 25), verify operations are performed. Boosting later in the process allows for less boosting leakage.

FIG. 26 is a table describing one embodiment of a process for programming using the structure of FIG. 4 or FIG. 5. FIG. 26 shows voltages applied during six successive time periods for the example of programming even NAND stings (and not odd NAND strings) with data that causes NAND string 210 to be programmed and NAND string 214 to be inhibited from being programmed. FIG. 26 shows voltage values BL200, BL202, SGDE, SGDO, WLn=2, WLn≠2 and SGS. During time period T1, all signals are at 0 volts. During T2, BL200, BL202, and SGDO are set at Vdd, while all word lines (WLN=2 and WLN≠2) and SGDE are at 0 volts. However, some or all word lines can be at a different voltage condition ($V_1$). SGS remains at 0v. Odd NAND strings are pre-charged during T2. At time T3, SGDO and BL200 are changed to 0v and SGDE is raised to Vdd so that odd NAND strings retain the pre-charge from T2 and even NAND strings that are to be inhibited are pre-charged in T3. At time T4, all NAND strings received Vpass and SGDE is changed to Vsgd. This allows boosting on all NAND strings that will not receive programming. At time T5, the programming voltage Vpgm is applied to the selected word line WLn=2 as a voltage pulse. At time T6, the voltages are returned to 0v. In some implementations, the process of FIG. 26 is repeated multiple times during programming of data. Between the pulses (e.g., between iterations of the process of FIG. 26), verify operations are performed.

The above embodiments for programming describe various pre-charging schemes for boosting. One problem that could arise for a shared BL that is connected to a programmable NAND string and an inhibited NAND string is that some of the boosted charge in the inhibited NAND string could leak across the channel of the boosted select gate transistor and into the drain side of the select gate drain transistor of inhibited NAND string. To overcome this, it is proposed to perform channel engineering whereby the Boron concentration in the channel of the drain side selection gate is increased towards bit line contact side of the drain selection gate making the channel doping concentration asymmetric.

Figure 27A:
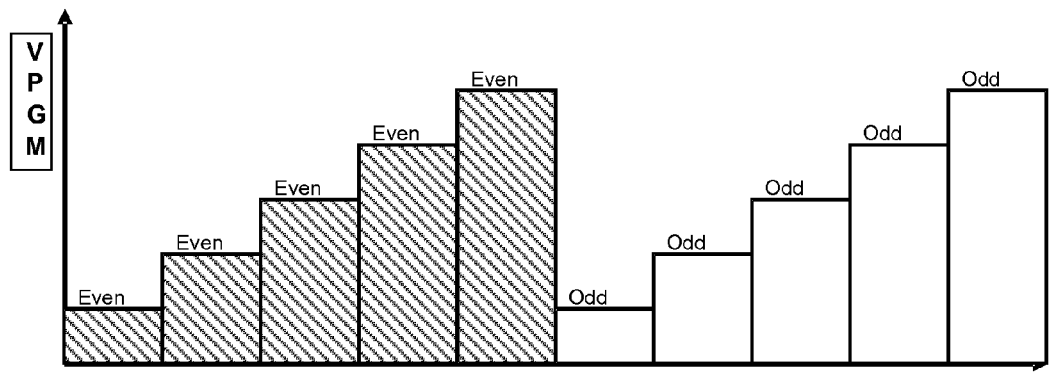
FIG. 27A shows voltage pulses used to program non-volatile storage.
Figure 27B:
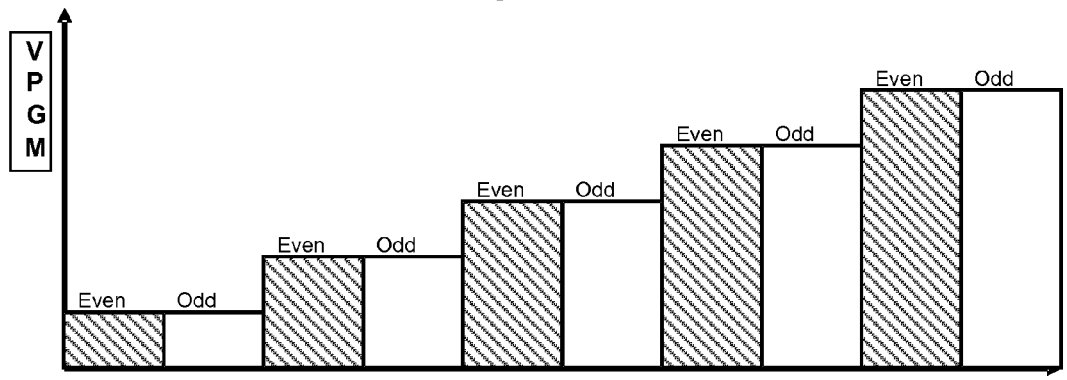
FIG. 27B shows voltage pulses used to program non-volatile storage.

As mentioned above, the program voltage Vpgm is applied as a series of pulses. FIGS. 27A and 27B show two different embodiments of program voltage pulses. For both figures, the shaded pulses program the even NAND strings while inhibiting the odd NAND strings. The unshaded pulses program the odd NAND strings while inhibiting the even NAND strings.

FIG. 27A depicts an embodiment in which first the even NAND strings are programmed (while the odd NAND strings are inhibited from programming) with a set of program pulses have magnitudes that increase for each successive pulse. After the even NAND strings have completed programming, then the odd NAND strings are programmed (while the even NAND strings are inhibited from programming) with a set of program pulses have magnitudes that increase for each successive pulse. In this embodiment, data for even NAND strings are first loaded into data latches and then the even NAND strings are programmed. After the even NAND strings are programmed, then data for odd NAND strings is loaded into data latches and then the odd NAND strings are programmed.

FIG. 27B depicts an embodiment where programming of even NAND strings are interleaved with programming of odd NAND strings. For example, a program pulse for even NAND strings at a first magnitude is applied, followed by a program pulse for odd NAND strings at the first magnitude being applied, followed by a program pulse for even NAND strings at a second magnitude being applied (second magnitude is greater than the first magnitude by a step size), followed by a program pulse for odd NAND strings at the second magnitude being applied, etc.

The programming schemes of FIGS. 24, 25 and 26 can be used with the programming pulses of FIG. 27A or 27B, as well as other sets of programming pulses. In the case of the interleaved programming depicted in FIG. 27B, verify operations can be performed after each pair of programming pulses that are at the same programming voltage. In some embodiments, extra latches may be needed to engage interleaved programming. For example, in an embodiment of 2 bits per cell technology, there may be two extra latches per sense amplifier (i.e. per bit line) just to accommodate the extra bits of data that are associated with interleaved programming. If coarse/fine programming is to be utilized also, then an additional third latch may also be required. Thus, in some embodiments of coarse/fine programming with two bits per memory cell, the number of latches per sense amplifier (or per bit line) grows from four to seven. The original set of latches for the non-interleaved case can be denoted as: 1) sense amplifier latch, 2) ADL, 3) BDL, and 4) XDL, where ADL and BDL are data latches for a multi-level (multi-state) information store and XDL is a data latch that is an out buffer or sense amplifier status signal store. The latches needed for interleaved programming can be denoted as: 1) sense amp latch, 2) ADLE, 3) ADLO, 4) BDLE, 5) BDLO, 6) XDLE, and 7) XDLO, where the E and the O at the end of the latch name designate even or odd. Extra latches add to the die size and cost; however, they help improve program speed and help dissipate floating gate to floating gate parasitic capacitance effects. An alternative to adding extra set of latches is to repeatedly transfer data from the controller for even and odd bit lines after each program pulse. This is currently very expensive in terms of both the time and energy required for the repeated transfer of same data after each program pulse. If the energy and performance costs associated with repeated data transfers come down in the future through the introductions of new data I/O schemes, then this method may become viable.

In yet another embodiment, if and when the data to be written is available on chip (i.e. residing in binary cache pages) then it may be possible to reduce the number of additional latches from three to one in the example discussed above. This would be made possible by repeatedly re-reading the data of even and odd cells from the binary cache and placing the data onto the latches at a rate of once per program pulse. In such an embodiment the number of latches for two bits per memory cell technology may increase from four to five, where the extra latch holds the coarse/fine programming information for interleaved programming.

Figure 28:
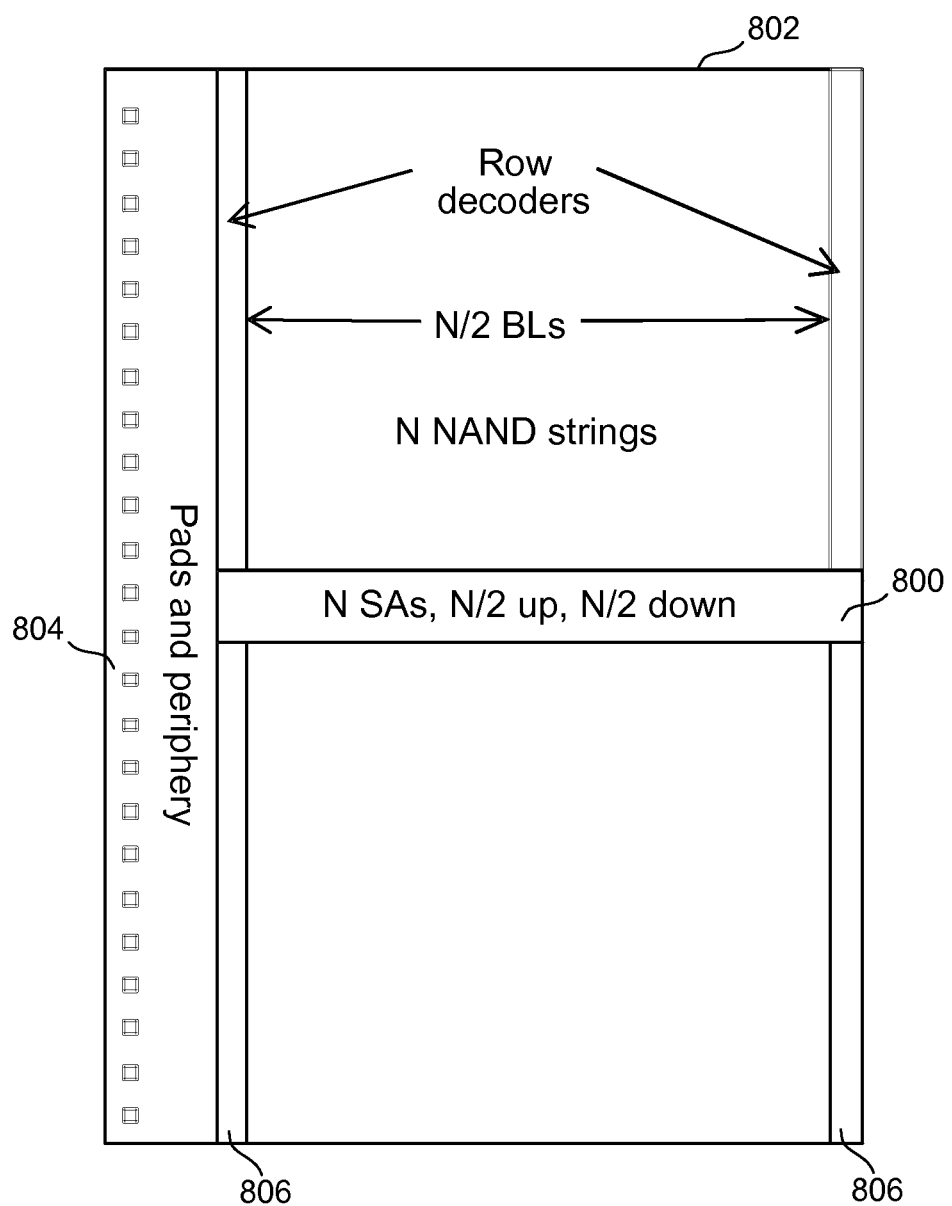
FIG. 28 depicts one embodiment for organizing a memory array and supporting circuitry.

FIG. 28 depicts a memory architecture where the sense amplifiers are placed in the middle of the memory array. For example, FIG. 28 shows the sense amplifiers in middle region 800 of memory array 802. Contact pads and peripheral circuits are depicted in region 804 and row decoders are positioned in areas 806. In one embodiment, half of the sense amplifiers are connected to a plane of blocks of memory cells above and the other half of the sense amplifiers are connected to a plane of blocks of memory cells below the sense amplifiers. The embodiment of FIG. 28 allows for bit line lengths to be decreased by a factor of two. As a result, bit line resistance and capacitance is reduced by factor of two. The bit line RC time constant is reduced by a factor of 4. The embodiment of FIG. 28 has the additional advantage of further reducing the bit line RC time constant by virtue of doubling bit line pitch.

Figure 29:
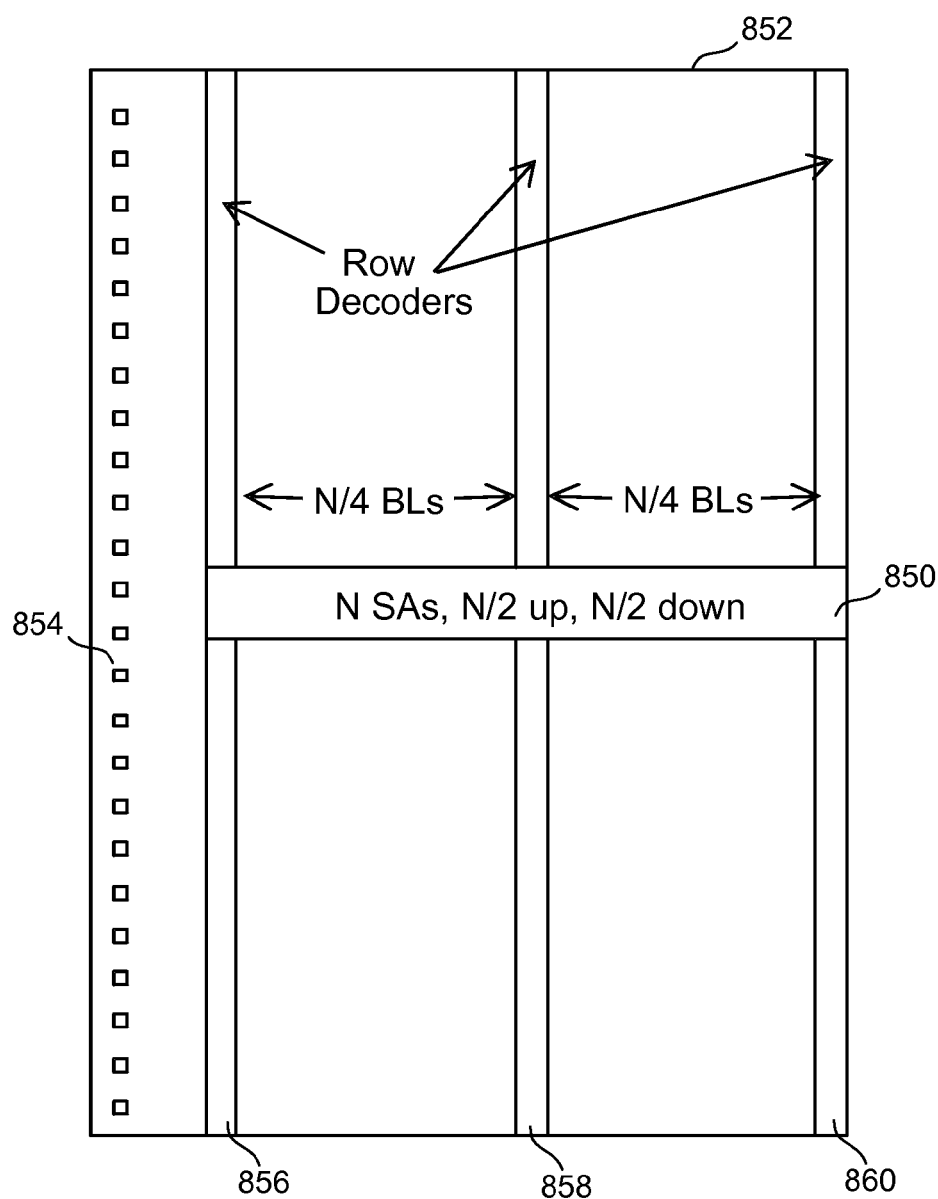
FIG. 29 depicts one embodiment for organizing a memory array and supporting circuitry.

The embodiments described above have one bit line for every pair of NAND strings. This doubles the pitch of the bit lines allowing for further reduction of bit line capacitance, resistance, and/or both, depending on new width and spacing of bit lines. With bit line time constants reduced substantially, further performance gain can be achieved by adding another shared row decoder to make word lines half the usual length and, thereby, reducing word line time constants also by a factor of 4. Such an embodiment is depicted in FIG. 29, which shows sense amplifiers in middle region 850 of memory array 852, contact pads and peripheral circuits are depicted in region 854, and row decoders are positioned in areas 856, 858 and 860. Areas 856 and 860 are on the side of the memory array. Area 858 is in the center of the memory array. This shared row decoder will add to die size, but depending on the application, this added cost may be warranted by the increase in performance.

With no lock out mode (a memory cell locked out from further programming) and faster bit lines, the shared bit line architecture mode provides maximum advantage in terms of energy savings. No lock out allows all bit lines to be charged up simultaneously and also discharged simultaneously. This has a very large impact in saving energy needed to charge and discharge bit lines. The advantage of no lock out or of fewer lock out operations than is typically performed are explained in U.S. Pat. No. 7,489,553 titled "Non-Volatile Memory With Improved Sensing Having Bit-Line Lockout Control;" U.S. Pat. No. 7,492,640 titled "Sensing With Bit-Line Lockout Control In Non-Volatile Memory;" U.S. Pat. No. 7,808,832 titled "Non-Volatile Memory With Improved Sensing Having Bit-Line Lockout Control," which are all incorporated herein by reference in their entirety.

In the above-described proposals, the drain side selection gate is split into EVEN and ODD on the drain side. However, the dual selection signal architecture can be used on the source side too (or instead of on the drain side). In such an embodiment, there would be two source side selection signals SGSE and SGSO. SGDE and SGSE are connected to even NAND strings. SGDO and SGSO are connected to odd NAND Strings. One potential benefit is that in the embodiments above, the systems reads the even NAND strings first and then the odd NAND strings (or vice versa). When even NAND strings are being read, due to high voltage on unselected WLs (Vread), the memory cells on odd NAND string can get disturbed due to undesired electron injection/ejection. When odd NAND strings are being read, due to high voltage on unselected WLs (Vread), the threshold voltage of memory cells on even NAND string can shift due to undesired electron injection/ejection. By using the split source side selection gate, this undesirable shift of threshold voltage of memory cells on NAND strings not being read can be lowered. When the system reads even NAND strings, SGDE and SGSE are ON (Vsg). But the SGDO and SGSO are off (0V). When the word lines are driven to VREAD while reading even NAND strings, it will boost the channel of odd NAND strings. As a result, the vertical field seen by odd NAND strings is lowered and undesirable shift of threshold voltage of memory cells on odd NAND strings while reading even NAND strings is mitigated.

Figure 30:
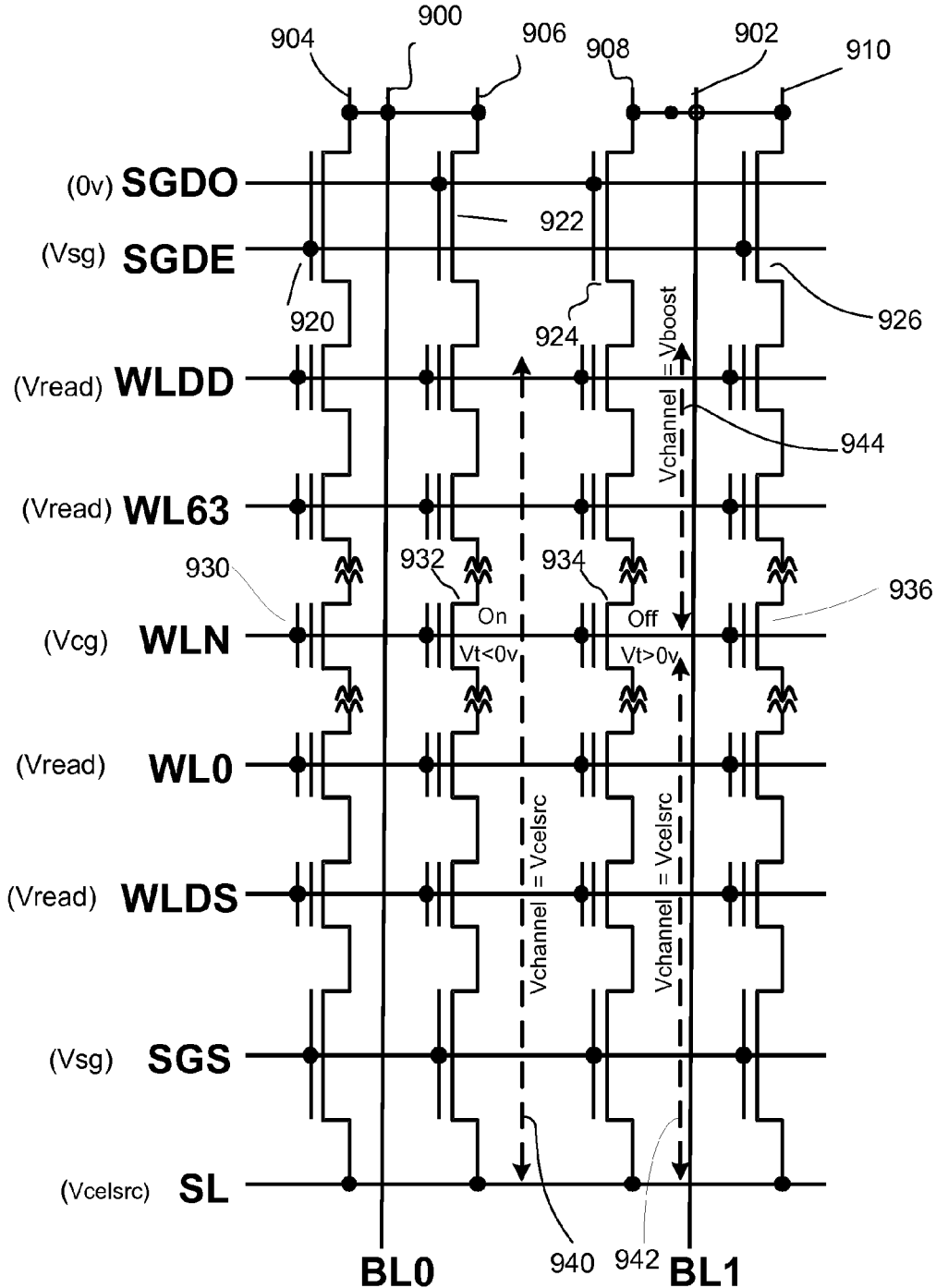
FIGS. 30 and 32A are partial schematics of four NAND strings.

FIG. 30 depicts a portion of an example memory array for which a bit line is shared between two NAND strings, where each NAND string includes only one drain side selection gate and the block includes two drain side selection signals. More specifically, FIG. 30 shows portions of four NAND strings. Two bit lines 900 and 902 are depicted. Bit line 900 is connected to NAND string 904 via selection gate 920 and NAND string 906 via selection gate 922. Bit line 902 is connected to NAND string 908 via selection gate 924 and connected to NAND string 910 via selection gate 926. Selection gates 920, 922, 924 and 926 are the same structure and operate like the selection gates described above (e.g., with respect to FIGS. 4-22G). The selected word line WLn is connected to memory cells 930 on NAND string 904, 932 on NAND string 906, 934 on NAND string 908 and 936 on NAND string 910.

Figure 31:
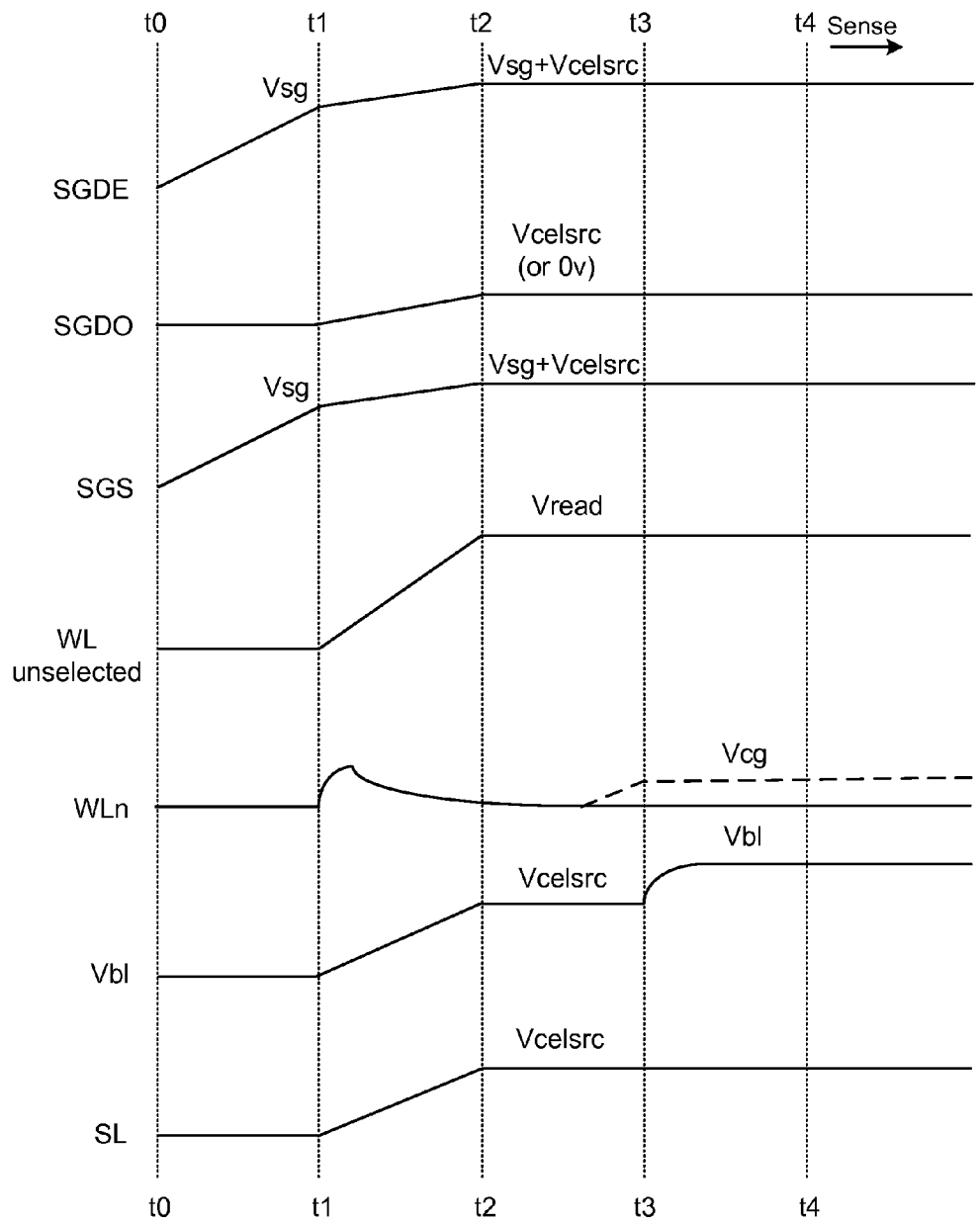
FIGS. 31-36 are timing diagrams of various embodiments of read operations.

FIG. 31 is a timing diagram describing one embodiment of a read (or sensing) process for the structure of FIG. 30. The process described in FIG. 31 can be used to read data or verify programming. In this embodiment, one half of the NAND strings are read at a given time while the other half are off. FIG. 30 shows a scenario where even NAND strings are being sensed/read and odd NAND strings are unselected. FIG. 31 shows the behavior of SGDE, SGDO, SGS, WL unselected (ie all word lines other than WLn), WLn (the selected word line), Vbl (the voltage on the bit line), and SL (the voltage on the source line). At time t0, all of the above-listed signals are at 0. At time t0, SGDE and SGS are ramped up to Vsg (e.g., ~2.2 volts). At time t1 WL unselected is raised to Vread (e.g., ~7-10 volts), Vbl is raised to Vcelsrc (e.g., ~1v), SGDO is raised to Vcelsrc (or kept at 0v) and SL is raised to Vcelsrc. The above-listed signals raised at t1 reach steady state by t2. Also at time t1, the selected word line experiences a small spike in voltage due to coupling from neighboring word lines. Between t2 and t3, the appropriate read compare voltage is applied to the selected word line WLn. For example, if the read operation is testing whether a binary memory cell is programmed or erased, then WLn=0v. If the read operation is testing whether a multi-state memory cell is programmed to State X then WLn=Y volts, where Y volts is the read compare voltage between State X and State X−1. The read compare voltage driven on WLn is referred to in FIG. 31 as Vcg. In some embodiments, the read compare voltage driven on the selected word line during a read operation is referred to as Vcgr. In some embodiments, the read compare voltage driven on the selected word line during a verify operation is referred to as Vcgv. At time t3, the bit line is raised to a bit line voltage Vbl (e.g., 1.2 v) suitable for the sensing operation. After t4, the selected memory cells are sensed.

FIG. 30 shows the voltages on the various signals after t4, during the sensing operation, and illustrates two issues: (1) some unselected memory cells may experience unwanted boosting in their channel and (2) some memory cells will experience conditions during a read operation that are different than the conditions during the relevant verify operation (which can lead to a read error).

In the example illustrated, NAND string 904 and NAND string 910 are selected (ie selectively electrically connected to bit lines 900 and 902) and NAND string 906 and NAND string 908 are unselected (ie selectively electrically isolated from bit lines 900 and 902). In this configuration, memory cells 930 and 936 can be read. All other memory cells depicted in FIG. 30 are not selected. WLn is receiving Vcg to sense the state of memory cells 930 and 936. However, memory cells 932 and 934 are also connected to WLn. For example purposes, assume that memory cell 932 is erased and has a threshold voltage (Vt) that is less than 0; therefore, memory cell 932 turns on in response to Vcg. For example purposes, assume that memory cell 934 is programmed and has a threshold voltage (Vt) that is greater than 0; therefore, memory cell 934 does not turn on in response to Vcg and remains off. Since memory cell 932 turns on in response to Vcg, the entire channel along NAND string 906 is biased at Vch=Vcelsrc based on the voltage on the source line SL (see dashed line 940). Memory cell 930 sees its neighboring channel along NAND string 906 at Vch=Vcelsrc. Since memory cell 934 is off, the channel above WLn along NAND string 908 is not connected to any voltage (ie floating) and hence it boosts when the word lines are ramped from 0 to Vread (see dashed line 944). So the voltage in the channel above WLn is at Vboost (which will be a function of Vread and the data pattern in the memory cells connected to word lines on the drain side of WLn). However, the channel below WLn along NAND string 908 is biased at Vcelsrc (see dashed line 942). Memory cell 936 sees neighboring channel along NAND string 908 at Vch≠Vcelsrc.

Consider the channel along NAND string 908. Across memory cell 934, the Vds is large (a function of Vboost and Vcelsrc) and Vgd is highly negative. This may cause GIDL (Gate Induced Drain Leakage) at the WLn drain junction and the resulting electrons may get injected into one of the floating gates on memory cells connected to word lines on the drain side of WLn (e.g., WLn+1 or WLn+2). This GIDL based injection of electrons will cause an unwanted increase of the threshold voltage of memory cells connected to word lines on the drain side of WLn, which may lead to an error.

Additionally, there is a mismatch between verify and read operations. The sensed threshold voltage of memory cells 930 and 936 depends on adjacent channel potential. The channel potential of the unselected NAND string depends on the Vt (threshold voltage) of the memory cell connected to WLn and the Vcg voltage on WLn. Since the Vt of the WLn memory cell may vary between verify operation and read operations, the channel voltage may vary (as discussed above) and the adjacent channel potential seen by memory cells 930 and 936 may be different between verify and read operations. This means that the Vt during the read operation of memory cells 930 and 936 maybe different from the Vt during the verify operation, leading to increased number of error bits.

In summary, word lines on the drain side of WLn may be receive unwanted boosting which may cause GIDL at the WLn drain, and the channel voltage in the unselected bit lines differs between verify and read operations. One proposed set of solutions avoid unwanted boosting by keeping the channels of the memory cells connected to word lines on the drain side of WLn biased at a fixed potential, such as Vcelsrc (through SGD or through SL via WLn), or another fixed potential, and maintain the same channel potential of VCELSRC along all unselected channels during both verify and read operations.

Figure 32:
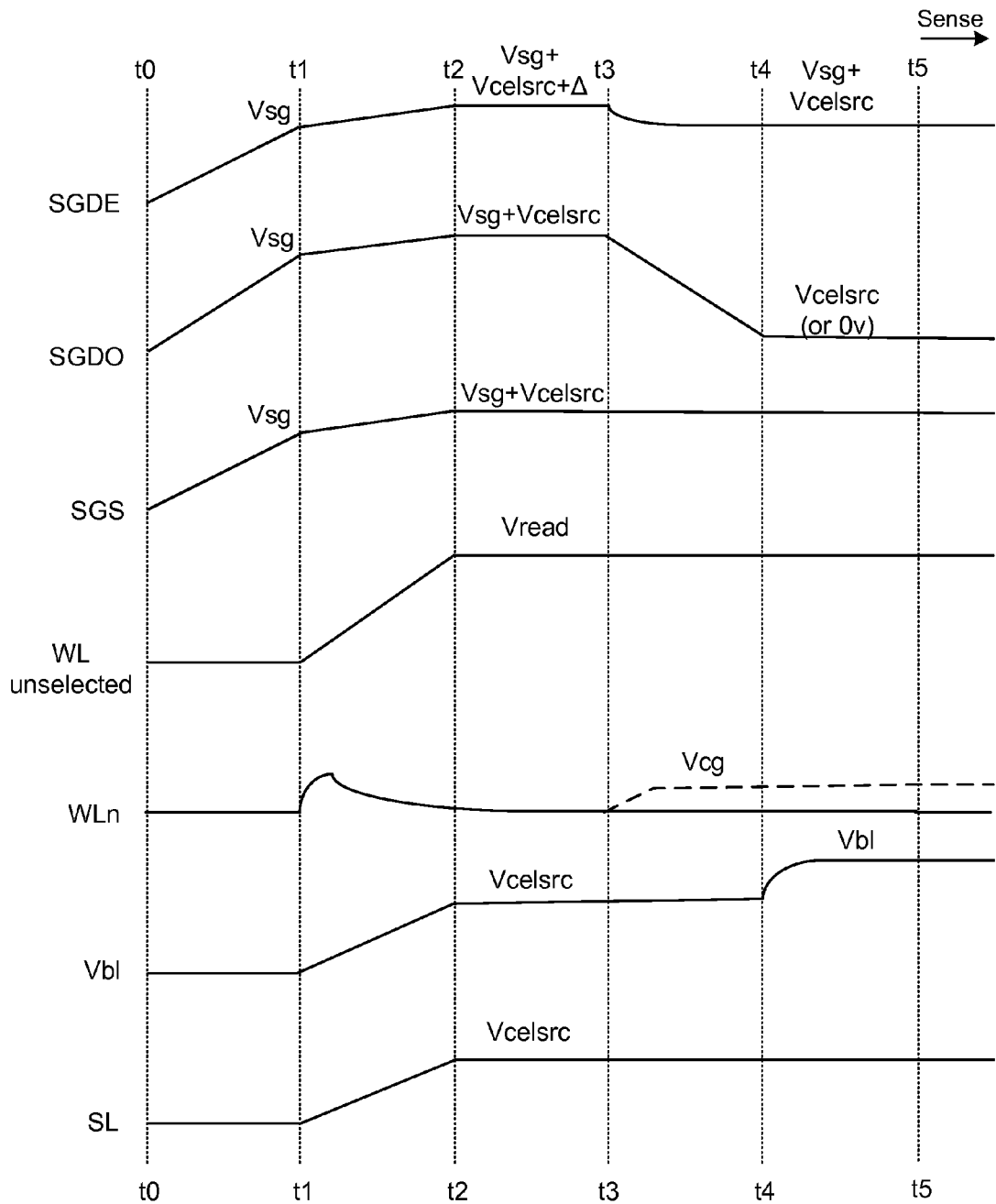

FIG. 32 is a timing diagram describing a first embodiment for reading data in a manner that overcomes the issues raised above. In this embodiment, the unselected NAND string channel is charged to Vcelsrc (or another fixed potential) from both source side and drain side; therefore, there is no unwanted boosting of the channel above Vcelsrc. FIG. 32 shows the behavior of SGDE, SGDO, SGS, WL unselected, WLn, Vbl, and SL. All signals start at 0v. At time t0, SGDE is raised to Vsg, SGDO is raised to Vsg and SGS is raised to Vsg. At time t1, SGDE is raised to Vsg+Vcelsrc+A (where A=1-2v) SGDE is raised to Vsg+Vcelsrc+Δ, rather than Vsg+Vcelsrc, to minimize settling time of SGDE due to coupling from SGDO. Also at time t1, SGDO is raised to Vsg+Vcelsrc, SGS is raised to Vsg+Vcelsrc, the unselected word lines (WL unselected) are raised to Vread (the unselected voltage), the bit line voltage Vbl is raised to Vcelsrc and the source line SL is raised to Vcelsrc. The selected word line WLn experiences a small spike due to coupling from neighboring word lines. At time t3, SGDO is lowered to 0 volts or Vcelsrc to disconnect the odd NAND strings and SGDE is lowered to Vsg+Vcelsrc (or Vsg) to continue to electrically select the even NAND strings. Also at t3, Vcg or 0 volts (depending on the sensing operation) is driven on the selected word line WLn. The bit line voltage is raised to Vbl at t4, and sensing begins after t5.

As can be seen from FIG. 32, SGS, SGDE and SGDO are turned ON and VBL and SL are charged to Vcelsrc at time t1. When unselected word lines (WL unselected) are ramped to Vread, no boosting (above Vcelsrc) can occur on odd NAND strings (e.g., 906 and 908) because SGDO is on, thereby, providing a path from the NAND string to the bit line. Thus, the channel regions of odd NAND strings (both above and below WLn) are charged to and maintained at Vcelsrc (rather than float). In the embodiment of FIG. 32, the channels on the drain side of the selected word line are at a fixed potential based on the bit line voltage and the channels on the source side of the selected word line are at a fixed potential based on the source line voltage.

Figure 32A:
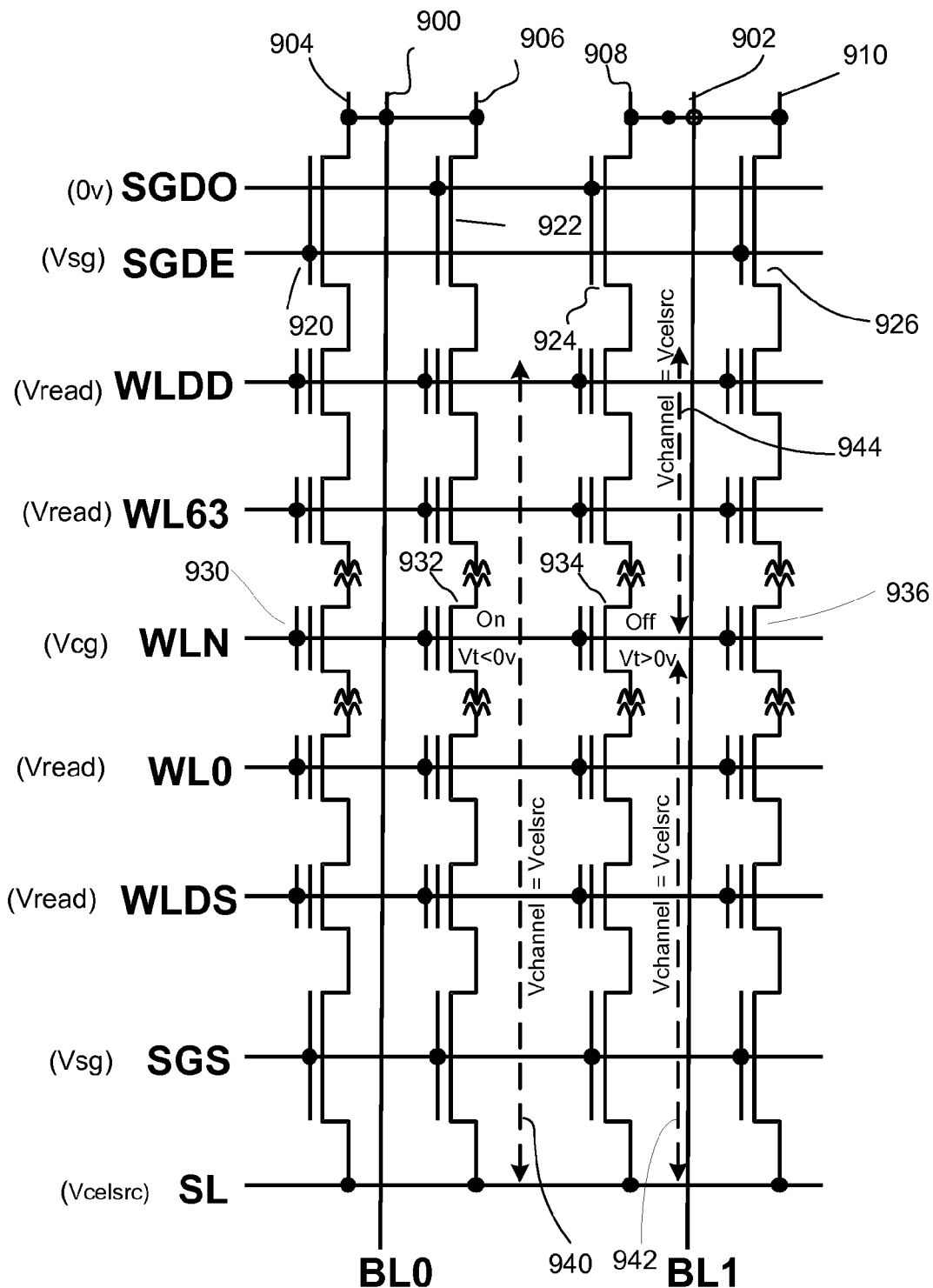

FIG. 32A shows the four NAND strings of FIG. 30 during the sensing of FIG. 32. Because the boosting above the fixed potential in the odd NAND strings is prevented, the channel below WLn and above WLn are pre-charged before sensing to Vcelsrc and maintained at Vcelsrc during the sensing. Vcelsrc is one example of a fixed potential that the channels are maintained at. Other fixed potentials can also be used. In some embodiments, the channels on the drain side of the selected word line are pre-charged to and maintained at the same fixed potential as the channels on the source side of the selected word line. In other embodiments, the channels on the drain side of the selected word line are pre-charged to and maintained at a different fixed potential as the channels on the source side of the selected word line. In other embodiments, the channels of the memory cells in the unselected NAND strings can be maintained at multiple different fixed potentials.

Figure 33:
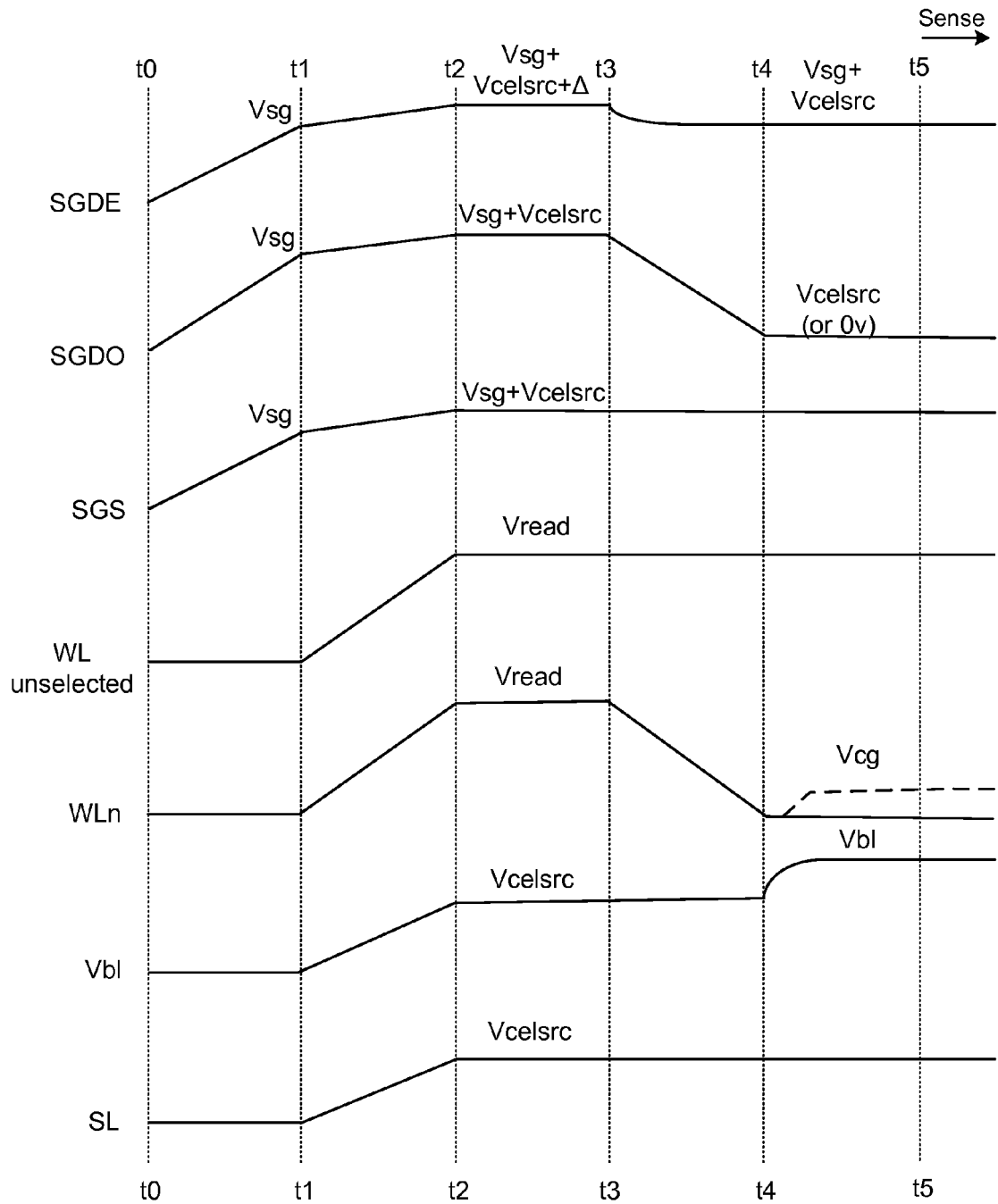

FIG. 33 is a timing diagram describing a second embodiment for reading data. In this embodiment, the unselected NAND string channel is charged to Vcelsrc (or another fixed potential) from both source side and drain side. FIG. 33 shows the behavior of SGDE, SGDO, SGS, WL unselected, WLn, Vbl, and SL. All signals start at 0v. The behavior of the signals in the embodiment of FIG. 33 is similar to FIG. 32, except for WLn. In the embodiment of FIG. 33, WLn is raised to Vread at t1 concurrently with raising the unselected word lines (WL unselected) to Vread. WLn is lowered from Vread to 0v at t3 concurrently with lowering the SGDO to Vcelsrc (or 0v). After t4, WLn can remain at 0v or rise to Vcg.

As can be seen from FIG. 33, SGS, SGDE and SGDO are turned ON, and VBL and SL are charged to Vcelsrc at time t1. When the word lines (WL unselected) are ramped to Vread, no boosting (above Vcelsrc) can occur on odd NAND strings (e.g., 906 and 908) because SGDO is on, thereby, providing a path from the NAND string to the bit line. Thus, the channel regions of odd NAND strings (both above and below WLn) are charged to Vcelsrc. Similar to as depicted in FIG. 32A, the channel below WLn and above WLn is at Vcelsrc.

Figure 34:
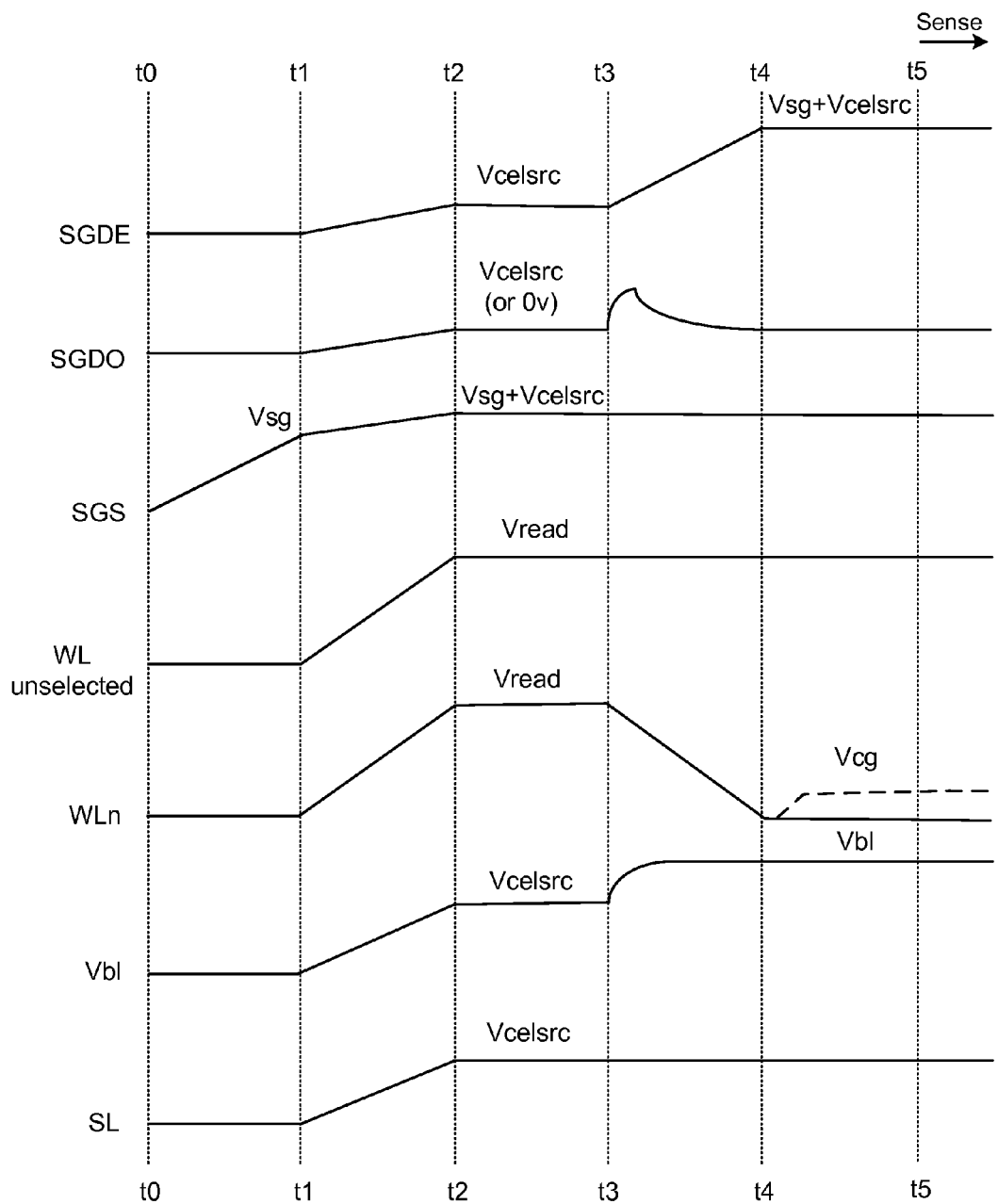

FIG. 34 is a timing diagram describing a third embodiment for reading data in which the entire channel of the unselected NAND string is charged from only the source side (ie from SL). To accomplish this, one example implementation drives all word lines to Vread so that the entire channel is in communication with the source signal SL.

FIG. 34 shows the behavior of SGDE, SGDO, SGS, WL unselected, WLn, Vbl, and SL. All signals start at 0v. At time t0 of FIG. 34, SGS is raised to Vsg. At time t1, SGDE is raised to Vcelsrc, SGDO is raised to Vcelsrc (or 0v), SGS is raised to Vsg_Vcelsrc, the selected word line WLn and the unselected word lines (WL unselected) are concurrently raised to Vread, the bit line BL is raised to Vcelsrc and the source line SL is raised to Vcelsrc. At time t3, SGDE is raised to Vsg+Vcelsrc to electrically connect even NAND strings, the bit line voltage is raised to Vbl, and WLn is lowered to 0v. At t4, Vcg or 0v are driven on the selected word line WLn. Sensing begins after t5. FIG. 34 also shows SGDO having a spike at t3 due to coupling from raising SGDE.

The embodiment of FIG. 34 includes applying Vcelsrc only from SGS side and using the selected word line WLn ramp from 0v to VREAD. Only SGS is turned on at t1, and VBL and SL both are charged to Vcelsrc. Since all WLs are ramped to Vread, all the NAND strings are fully on and all the channels are at Vcelsrc; therefore, there is no boosting (as the channel is at a fixed potential rather than floating). There is also no mismatch between verify and read operations as the entire channel area of all odd NAND strings will be at Vcelsrc. Only SGDE is turned on at t3. Note that since SGDO was off, the system can start ramping the bit line to Vbl at t3.

Figure 35:
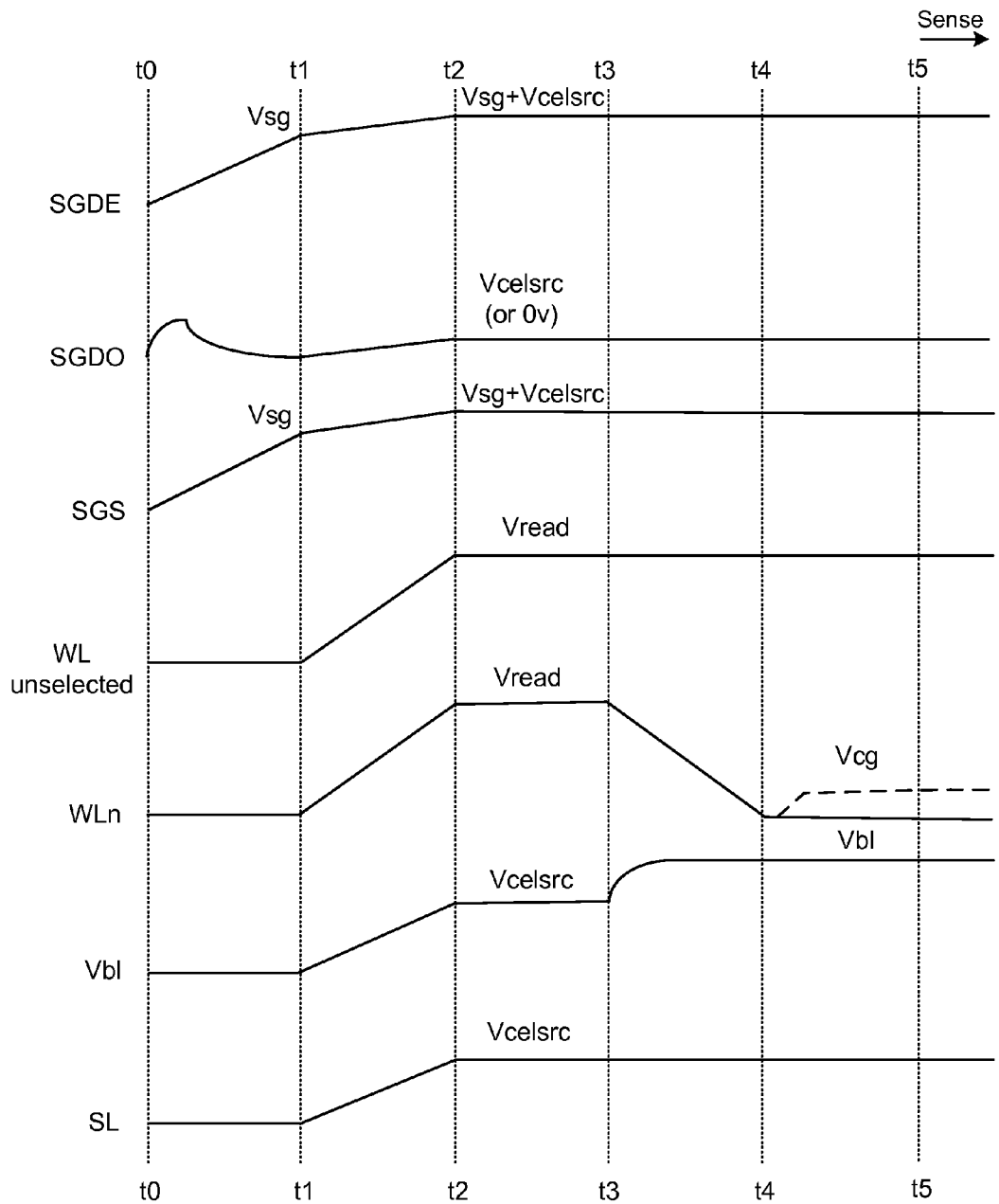

FIG. 35 is a timing diagram describing a fourth embodiment for reading data in which the entire channel of the unselected NAND string is charged from only the source side. To accomplish this, one example implementation drives all word lines to Vread so that the entire channel is in communication with the source signal SL.

FIG. 35 shows the behavior of SGDE, SGDO, SGS, WL unselected, WLn, Vbl, and SL. All signals start at 0v. At time t0 of FIG. 35, SGS and SGDE are raised to Vsg. FIG. 35 also shows SGDO having a spike at t0 due to coupling from raising SGDE. At time t1, the unselected word lines (WL unselected) and the selected word line WLn are raised to Vread. Additionally, SGS and SGDE are raised to Vsg+Vcelsrc, SGDO is raised to Vcelsrc (or 0v) the bit line is raised to Vcelsrc, the source line SL is raised to Vcelsrc. At time t3, the bit line voltage is raised to Vbl and the selected word line WLn is lowered to 0v. Just after t4, Vcg or 0v is driven on the selected word line WLn. Sensing begins after t5. Since all WLs are ramped to Vread, all the NAND strings are fully on and the all the channels are at Vcelsrc; therefore, there is no boosting (as the channel is at a fixed potential rather than floating). There is also no mismatch between verify and read operations as the entire channel area of all odd NAND strings will be at Vcelsrc.

Figure 36:
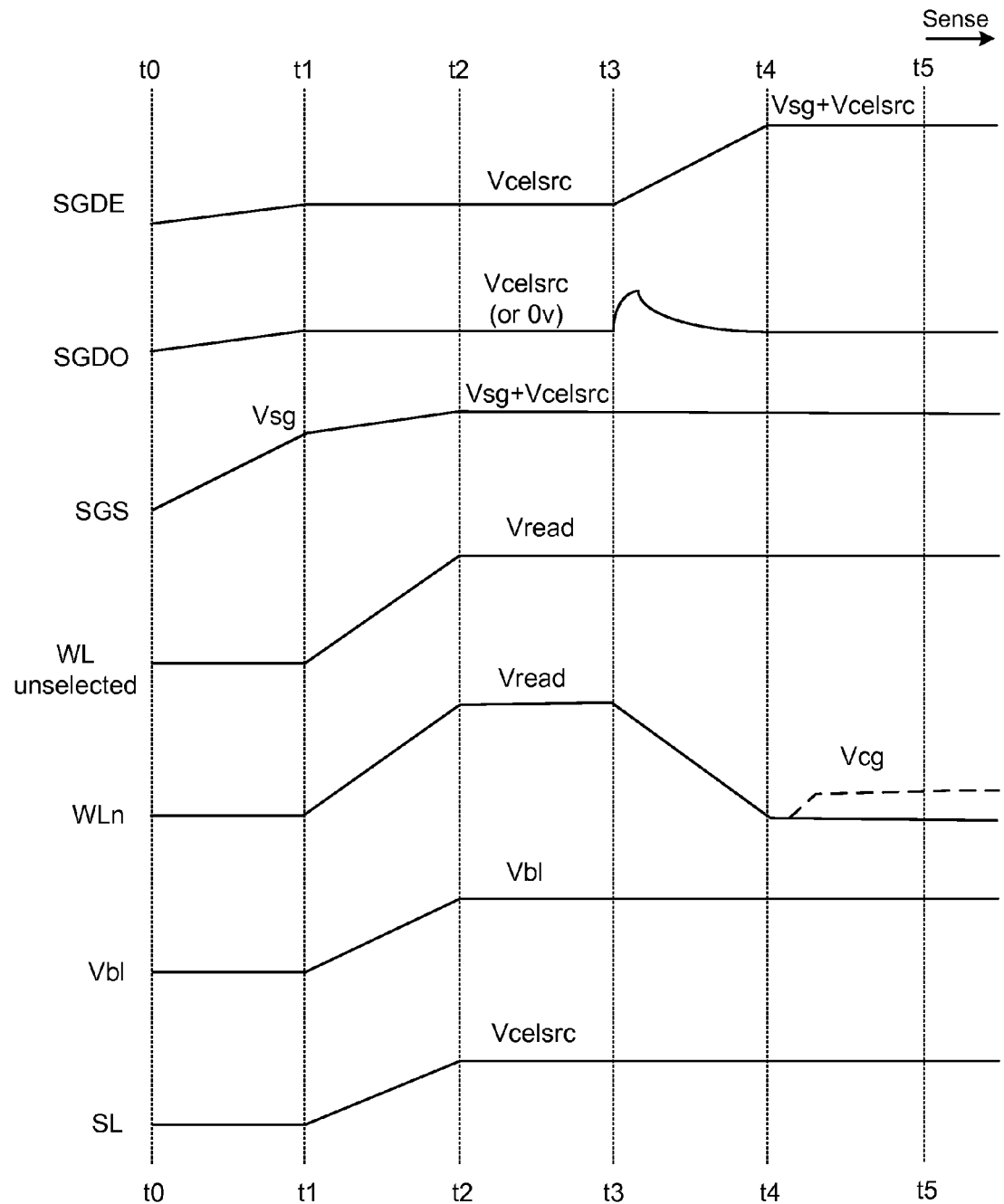

FIG. 36 is a timing diagram describing a fifth embodiment for reading data in which the entire channel of the unselected NAND string is charged from only the source side. To accomplish this, one example implementation drives all word lines to Vread so that the entire channel is in communication with the source signal SL.

FIG. 36 shows the behavior of SGDE, SGDO, SGS, WL unselected, WLn, Vbl, and SL. All signals start at 0v. At time t0, SGS is raised to Vsg, SGDE is raised to Vcelsrc and SGDO is raised to Vcelsrc (or 0v). At t1, the unselected word lines (WL unselected) and the selected word line WLn are raised to Vread, the bit line is raised to Vbl, SGS is raised to Vsg+Vcelsrc, and the source line SL is raised to Vcelsrc. At time t3, SGDE is raised to VSG+Vcelsrc to connect even NAND strings, and the selected word line is lowered to 0v. FIG. 36 also shows SGDO having a spike at t3 due to coupling from raising SGDE. At t4, Vcg or 0v is driven on the selected word line WLn. Sensing begins after t5. In the embodiments of FIGS. 34-36, the channels on the drain side of the selected word line and the channels on the source side of the selected word line are at a fixed potential based on the source line voltage. Since all WLs are ramped to Vread, all the NAND strings are fully on and the all the channels are at Vcelsrc; therefore, there is no boosting (as the channel is at a fixed potential rather than floating). There is also no mismatch between verify and read operations as the entire channel area of all odd NAND strings will be at Vcelsrc.

The processes depicted in FIGS. 32-36 describe one sensing operation. A read or verify process may include one or multiple sensing operations. For example, reading binary flash memory may only require one sensing operation at Vcg=0v. However, reading multistate flash memory may require performing sensing operations at multiple read compare points between data states in order to determine which data state the memory cell is in, with each data state representing multiple bits of data. In some embodiments, when the system performs multiple reads/verify operations sequentially, SGDE/O need to be set only before the $1^{st}$ read in the read sequence.

Note that the above embodiments describe structures with two NAND strings sharing a common bit line. In other embodiments, more than two NAND strings can share a common bit line using the teachings above.

One embodiment includes electrically selecting one group of non-volatile storage elements for each bit line of a plurality of bit lines in a system that includes multiple groups of non-volatile storage elements in a common block being connected to each bit line of the plurality of bit lines, each group of non-volatile storage elements comprises multiple connected non-volatile storage elements; applying an unselected voltage to unselected word lines; maintaining, at a first fixed potential, channels of non-volatile storage elements that are connected to word lines on a drain side of a selected word line and that are in unselected groups of non-volatile storage elements; and applying a read compare voltage to the selected word line and sensing non-volatile storage elements connected to the selected word line and that are in selected groups of non-volatile storage elements.

In some embodiments, the maintaining further includes maintaining, at a second fixed potential, channels of non-volatile storage elements that are connected to word lines on a source side of the selected word line and that are in the unselected groups of non-volatile storage elements. The first fixed potential can be the same as or different than the second fixed potential.

In some embodiments, each group of non-volatile storage elements is connected to one source side select signal and two drain side select signals. In various alternatives: the maintaining includes turning on the two drain side select signals to allow the first fixed potential to be pre-charged from a respective bit line, the maintaining includes turning off the two drain side select signals and turning on the source side select signal; and the maintaining includes turning on only one of the two drain side select signals and turning on the source side select signal.

Some examples include applying the first fixed potential from a respective bit line and/or applying the first fixed potential from a common source line for the groups.

The non-volatile storage elements can be any suitable type of non-volatile storage element. In one suitable example, the groups of non-volatile storage elements are NAND strings.

In one example, the applying the unselected voltage to unselected word lines and the maintaining are performed without boosting above the first fixed potential the channels of non-volatile storage elements that are connected to word lines on a drain side of a selected word line and that are in unselected groups of non-volatile storage elements.

One embodiment of a non-volatile storage apparatus comprises a plurality of non-volatile storage elements arranged into groups of connected non-volatile storage elements; a plurality of bit lines, each of the bit lines are connected to multiple groups; a plurality of word lines, each of the word lines are connected to multiple groups; and one or more managing circuits in communication with the non-volatile storage elements via the bit lines and word lines. The one or more managing circuits select one group for each bit line. The one or more managing circuits apply an unselected voltage to unselected word lines. The one or more managing circuits maintain at a first fixed potential channels of non-volatile storage elements that are connected to word lines on a drain side of a selected word line and that are in unselected groups. The one or more managing circuits apply a read compare voltage to the selected word line and sense non-volatile storage elements connected to the selected word line that are in selected groups.

One embodiment includes electrically selecting one NAND string for each of a plurality of bit lines of a system where multiple NAND strings in a common block are connected to each bit line of the plurality of bit lines, the NAND strings have channels; applying an unselected voltage to unselected word lines; maintaining the channels of memory cells connected to word lines on both sides of a selected word line at one or more fixed potentials; and applying a read compare voltage to a selected word line and sensing non-volatile storage elements connected to the selected word line.

One embodiment includes electrically selecting one NAND string for each of a plurality of bit lines of a system where multiple NAND strings in a common block are connected to each bit line of the plurality of bit lines, the NAND strings have channels; applying an unselected voltage to unselected word lines; applying a source voltage via a common source connection for NAND strings of the common block to pre-charge to the source voltage source sides of the channels of unselected NAND strings; applying bit line voltages to the plurality of bit lines to pre-charge to the bit line voltages drain sides of the channels of unselected NAND strings; and applying a read compare voltage to a selected word line and sensing non-volatile storage elements connected to the selected word line.

One embodiment includes electrically selecting one NAND string for each of a plurality of bit lines of a system where multiple NAND strings in a common block are connected to each bit line of the plurality of bit lines, the NAND strings have channels; applying a read pass voltage to unselected word lines; applying a source voltage via a common source connection for NAND strings of the common block to pre-charge to the source voltage both sides of the channels, with respect to a selected word line, of unselected NAND strings; and applying a read compare voltage to a selected word line and sensing non-volatile storage elements connected to the selected word line.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of reading non-volatile storage, comprising:
   electrically selecting one group of non-volatile storage elements for each bit line of a plurality of bit lines in a system that includes multiple groups of non-volatile storage elements in a common block being connected to each bit line of the plurality of bit lines, each group of non-volatile storage elements comprises multiple connected non-volatile storage elements and a drain side select gate;
   applying an unselected voltage to unselected word lines;
   using drain side select gates to apply a first voltage from bit lines to channels of non-volatile storage elements that are connected to word lines on a drain side of a selected word line and that are in a plurality of unselected groups of non-volatile storage elements; and
   applying a read compare voltage to the selected word line and sensing non-volatile storage elements that are connected to the selected word line and that are in selected groups of non-volatile storage elements.

2. The method of claim 1, further comprising, applying a second voltage to channels of non-volatile storage elements that are connected to word lines on a source side of the selected word line and that are in the plurality of unselected groups of non-volatile storage elements.

3. The method of claim 2, wherein:
   the first voltage is the same as the second voltage.

4. The method of claim 2, further comprising:
   applying the unselected voltage to the selected word line while applying the unselected voltage to the unselected word lines.

5. The method of claim 1, wherein:
   each group of non-volatile storage elements is connected to one source side select signal and two drain side select signals; and
   the applying the first voltage includes turning on the two drain side select signals to allow the first voltage to be pre-charged from a respective bit line.

6. The method of claim 1, further comprising:
   applying the first voltage from a common source line for the groups, each group of non-volatile storage elements is connected to one source side select signal and two drain side select signals, the applying the first voltage includes turning on only one of the two drain side select signals and turning on the source side select signal.

7. The method of claim 1, wherein:
   the groups of non-volatile storage elements are NAND strings.

8. The method of claim 1, wherein:
   the applying the unselected voltage to unselected word lines and the applying the first voltage are performed without boosting the channels of non-volatile storage elements that are connected to word lines on the drain side of the selected word line and that are in unselected groups of non-volatile storage elements.

9. The method of claim 1, wherein:
   the read compare voltage is less than threshold voltages of non-volatile storage elements that are connected to the selected word line and that are in the plurality of unselected groups of connected non-volatile storage elements.

10. The method of claim 1, wherein:
    the multiple groups of non-volatile storage elements are arranged in a three dimensional memory structure.

11. A method of reading non-volatile storage, comprising:
    electrically selecting one group of non-volatile storage elements for each bit line of a plurality of bit lines in a system that includes multiple groups of non-volatile storage elements in a common block being connected to each bit line of the plurality of bit lines, each group of non-volatile storage elements comprises multiple connected non-volatile storage elements, each group of non-volatile storage elements is connected to one source side select signal and two drain side select signals;
    applying an unselected voltage to unselected word lines;
    applying a first voltage to channels of non-volatile storage elements that are connected to word lines on a drain side of a selected word line and that are in a plurality of unselected groups of non-volatile storage elements, the applying the first voltage includes applying the first voltage from a common source line for the groups, the applying the first voltage includes turning off the two drain side select signals and turning on the source side select signal; and
    applying a read compare voltage to the selected word line and sensing non-volatile storage elements that are connected to the selected word line and that are in selected groups of non-volatile storage elements.

12. A non-volatile storage apparatus, comprising:
    a plurality of non-volatile storage elements arranged into groups of connected non-volatile storage elements, each of the groups include a drain side select gate;
    a plurality of bit lines, each of the bit lines are connected to multiple groups in a same block;
    a plurality of word lines, each of the word lines are connected to multiple groups; and
    one or more managing circuits in communication with the non-volatile storage elements via the bit lines and word lines, the one or more managing circuits are configured to select one group of connected non-volatile storage elements for each bit line, the one or more managing circuits are configured to apply an unselected voltage to unselected word lines connected to the groups of connected non-volatile storage elements, the one or more managing circuits are configured to apply a first voltage from bit lines through drain select gates to a set of channels of non-volatile storage elements that are connected to word lines on a drain side of a selected word line and that are in a plurality of unselected groups of connected non-volatile storage elements, the one or more managing circuits are configured to apply a read compare voltage to the selected word line and sense non-volatile storage elements connected to the selected word line and that are in selected groups of connected non-volatile storage elements.

13. The apparatus of claim 12, wherein:
    the one or more managing circuits maintain, at a fixed potential, channels of non-volatile storage elements that are connected to word lines on a source side of the selected word line and that are in the unselected groups of non-volatile storage elements.

14. The apparatus of claim 12, further comprising:
    one source side select signal and two drain side select signals connected to the groups, the one or more managing circuits turn on only one of the two drain side select signals and turn on the source side select signal.

15. The non-volatile storage apparatus of claim 12, wherein:
    the groups of connected non-volatile storage elements are NAND strings.

16. The non-volatile storage apparatus of claim 12, wherein:
plurality of non-volatile storage elements arranged in a three dimensional memory structure.

17. A non-volatile storage apparatus, comprising:
a plurality of non-volatile storage elements arranged into groups of connected non-volatile storage elements;
a plurality of bit lines, each of the bit lines are connected to multiple groups in a same block;
a plurality of word lines, each of the word lines are connected to multiple groups;
one or more managing circuits in communication with the non-volatile storage elements via the bit lines and word lines, the one or more managing circuits are configured to select one group for each bit line, the one or more managing circuits are configured to apply an unselected voltage to unselected word lines, the one or more managing circuits are configured to maintain at a first fixed potential channels of non-volatile storage elements that are connected to word lines on a drain side of a selected word line and that are in unselected groups, the one or more managing circuits are configured to apply a read compare voltage to the selected word line and sense non-volatile storage elements connected to the selected word line that are in selected groups; and
one source side select signal line and two drain side select signal lines connected to the groups, the one or more managing circuits turn off the two drain side select signal lines and turn on the source side select signal line to allow the first fixed potential to be pre-charged.

18. The non-volatile storage apparatus of claim 17, wherein:
plurality of non-volatile storage elements arranged in a three dimensional memory structure.

19. A method of reading non-volatile storage, comprising:
electrically selecting one NAND string for each of a plurality of bit lines of a system where multiple NAND strings in a common block are connected to each bit line of the plurality of bit lines, the NAND strings have channels, each NAND string has a drain side select gate;
applying an unselected voltage to unselected word lines;
maintaining, at one or more fixed potentials, channels of memory cells that are on unselected NAND strings and that are connected to word lines on a drain side of a selected word line by using a respective drain side select gate to apply a respective voltage from a respective bit line to the channels; and
applying a read compare voltage to the selected word line and sensing non-volatile storage elements connected to the selected word line.

20. A method of reading non-volatile storage, comprising:
electrically selecting one NAND string for each of a plurality of bit lines of a system where multiple NAND strings in a common block are connected to each bit line of the plurality of bit lines, the NAND strings have channels;
applying an unselected voltage to unselected word lines;
applying a source voltage via a common source connection for NAND strings of the common block in order to apply the source voltage to portions of channels of unselected NAND strings that are on a source side of a selected word line;
applying non-zero bit line voltages to the plurality of bit lines in order to apply the non-zero bit line voltages to portions of channels of unselected NAND strings that are on a drain side of a selected word line; and
applying a read compare voltage to a selected word line and sensing non-volatile storage elements connected to the selected word line.

21. A non-volatile storage apparatus, comprising:
a plurality of non-volatile storage elements arranged into groups of connected non-volatile storage elements in a common block that have a common source connection;
a plurality of bit lines, each of the bit lines are connected to multiple groups;
a plurality of word lines, each of the word lines are connected to multiple groups; and
one or more managing circuits in communication with the non-volatile storage elements via the bit lines and word lines, the one or more managing circuits are configured to select one group for each of the bit lines, the one or more managing circuits are configured to apply an unselected voltage to unselected word lines, the one or more managing circuits are configured to apply a read compare voltage to the selected word line and sense non-volatile storage elements connected to the selected word line that are in selected groups, the one or more managing circuits are configured to apply a source voltage via the common source connection in order to apply the source voltage to portions of channels of unselected groups that are on a source side of a selected word line, the one or more managing circuits are configured to apply non-zero bit line voltages to one or more of the bit lines in order to apply the non-zero bit line voltages to portions of channels of unselected groups that are on a drain side of a selected word line.

22. The non-volatile storage apparatus of claim 21, wherein:
plurality of non-volatile storage elements arranged in a three dimensional memory structure.

* * * * *